United States Patent
Marutani et al.

(10) Patent No.: US 10,529,635 B2
(45) Date of Patent: Jan. 7, 2020

(54) MANUFACTURING METHOD OF SEMICONDUCTOR PACKAGE INCLUDING LASER PROCESSING

(71) Applicant: J-DEVICES CORPORATION, Usuki, Oita (JP)

(72) Inventors: Hisakazu Marutani, Nomi (JP); Minoru Kai, Nomi (JP); Kazuhiko Kitano, Nomi (JP)

(73) Assignee: J-Devices Corporation, Usuki (JP)

( * ) Notice: Subject to any disclaimer, the term of this patent is extended or adjusted under 35 U.S.C. 154(b) by 0 days.

(21) Appl. No.: 15/493,231

(22) Filed: Apr. 21, 2017

(65) Prior Publication Data

US 2017/0316998 A1    Nov. 2, 2017

(30) Foreign Application Priority Data

Apr. 28, 2016 (JP) ................................ 2016-090335

(51) Int. Cl.
*H01L 23/31* (2006.01)
*H01L 21/56* (2006.01)
*H01L 21/82* (2006.01)
*H01L 23/544* (2006.01)
*H01L 23/00* (2006.01)

(52) U.S. Cl.
CPC .......... *H01L 23/3107* (2013.01); *H01L 21/56* (2013.01); *H01L 21/82* (2013.01); *H01L 23/544* (2013.01); *H01L 24/17* (2013.01); *H01L 2924/182* (2013.01)

(58) Field of Classification Search
CPC ... H01L 23/3107; H01L 23/544; H01L 24/17; H01L 21/56; H01L 21/82; H01L 2924/182
See application file for complete search history.

(56) References Cited

U.S. PATENT DOCUMENTS

| | | | |
|---|---|---|---|
| 2005/0186760 A1* | 8/2005 | Hashimura | B23K 26/18 438/460 |
| 2006/0205182 A1* | 9/2006 | Soejima | H01L 21/78 438/460 |
| 2012/0038053 A1* | 2/2012 | Oh | H01L 21/561 257/773 |
| 2012/0074565 A1* | 3/2012 | Koroku | H01L 21/78 257/737 |
| 2013/0337633 A1* | 12/2013 | Seddon | H01L 21/78 438/462 |

(Continued)

FOREIGN PATENT DOCUMENTS

| | | |
|---|---|---|
| JP | 2007043100 A | 2/2007 |
| JP | 2009088252 A | 4/2009 |
| JP | 2010016361 A | 1/2010 |

(Continued)

*Primary Examiner* — Thanh T Nguyen
(74) *Attorney, Agent, or Firm* — Kevin B. Jackson

(57) ABSTRACT

A manufacturing method of a semiconductor package includes locating a plurality of semiconductor packages on a substrate, forming a resin insulating layer covering the plurality of semiconductor devices, forming grooves, in the resin insulating layer, enclosing each of the plurality of semiconductor devices and reaching the substrate, and irradiating the substrate with laser light in positional correspondence with the grooves to separate the plurality of semiconductor devices from each other.

12 Claims, 15 Drawing Sheets

(56) References Cited

U.S. PATENT DOCUMENTS

2015/0085169 A1\* 3/2015 Igarashi ............... H01L 25/042
348/294

FOREIGN PATENT DOCUMENTS

| JP | 2010-278334 A | 12/2010 |
|----|---------------|---------|
| JP | 2015037145 A  | 2/2015  |
| JP | 2016025282 A  | 2/2016  |

\* cited by examiner

MANUFACTURING METHOD OF SEMICONDUCTOR PACKAGE INCLUDING LASER PROCESSING

CROSS REFERENCE TO RELATED APPLICATIONS

This application is based upon and claims the benefit of priority from the prior Japanese Patent Application No. 2016-090335 filed on Apr. 28, 2016, the entire contents of which are incorporated herein by reference.

FIELD

The present invention relates to a semiconductor package and a manufacturing method of the same, specifically, to a technology for mounting a semiconductor device on a substrate, and also relates to a shape of an end of a substrate having a semiconductor device mounted thereon.

BACKGROUND

Conventionally, an electronic device such as a mobile phone, a smartphone or the like includes a semiconductor package structure including a support substrate and a semiconductor device such as an IC chip or the like mounted thereon (see, for example, Japanese Laid-Open Patent Publication No. 2010-278334). Generally in such a semiconductor package, a semiconductor device such as an IC chip, a memory or the like is bonded on a support substrate with an adhesive layer being provided therebetween, and the semiconductor device is covered with a sealing member (formed of a resin material for sealing), so that the semiconductor device is protected.

The support substrate used for such a semiconductor device may be any of various substrates including a printed substrate, a ceramic substrate and the like. Especially recently, a semiconductor package including a metal substrate has been progressively developed. A semiconductor package including a metal substrate and a semiconductor device mounted thereon and fanned out by re-wiring has an advantage of being superb in electromagnetic shielding characteristics and thermal characteristics and now is a target of attention as a highly reliable semiconductor package. Such a semiconductor package also has an advantage of having a high degree of designing freedom.

In the case of a structure including a support substrate and a semiconductor device mounted thereon, a plurality of semiconductor devices may be mounted on a large support substrate, so that a plurality of semiconductor packages may be manufactured in one manufacturing process. In this case, the plurality of semiconductor packages formed on the support substrate are separated into individual pieces after the manufacturing process is finished, and thus individual semiconductor packages are provided. As can be seen from this, the semiconductor package structure including a support substrate and a semiconductor package mounted thereon also has an advantage of being high in mass-productivity.

In the case where a plurality of semiconductor packages are mass-produced using a large metal substrate as a support substrate as described above, the plurality of semiconductor packages formed on the metal substrate need to be separated from each other as individual semiconductor packages by a mechanical method, for example, by use of a dicing blade or the like. If the metal substrate is cut by a dicing blade for the separation, the dicing blade is abraded and needs to be replaced with a new one in a short time.

SUMMARY

A manufacturing method of a semiconductor package in an embodiment according to the present invention includes locating a plurality of semiconductor packages on a substrate, forming a resin insulating layer covering the plurality of semiconductor devices, forming grooves, in the resin insulating layer, enclosing each of the plurality of semiconductor devices, and irradiating the substrate with laser light in positional correspondence with the grooves to separate the plurality of semiconductor devices from each other.

The grooves may reach the substrate.

Recessed portions may be formed in the substrate and below the grooves while a process of formation of the grooves is performed.

A surface of the substrate opposite to a surface on which the resin insulating layer is formed may be irradiated with the laser light.

Regions each having a width smaller than that of each of the grooves may be irradiated with the laser light.

The grooves may be formed by a dicing blade.

A semiconductor package in an embodiment according to the present invention includes a substrate having a first surface, a second surface opposite to the first surface, and a side surface connecting a first end of the first surface and a second end of the second surface to each other, a semiconductor device located on the first surface, and a resin insulating layer covering the semiconductor device. The side surface is curved from the first end toward the second end.

The second end may protrude outward with respect to the substrate more than the first end.

The side surface may have a curved shape including an inflection point between the first end and the second end.

The first end and an end of the resin insulating layer may be continuous to each other.

DESCRIPTION OF EMBODIMENTS

Figure 1:
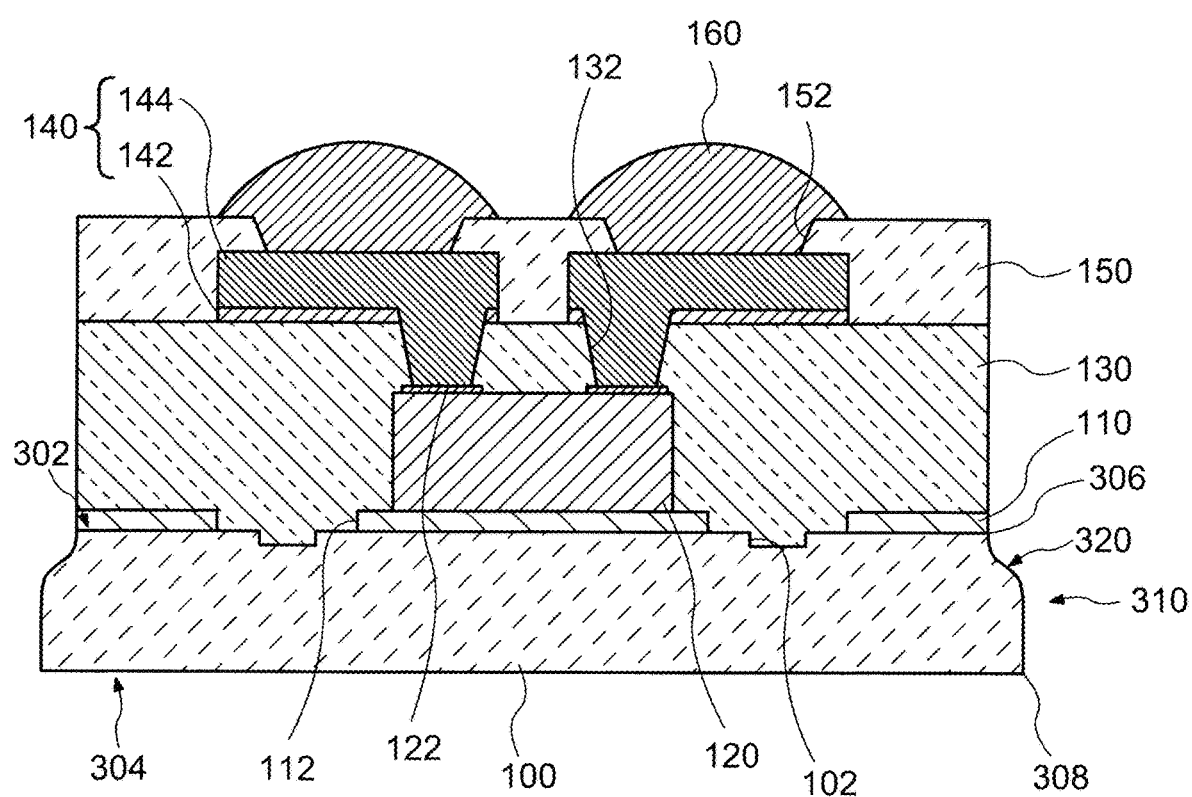
FIG. 1 is a schematic cross-sectional view of a semiconductor package in an embodiment according to the present invention.

Hereinafter, a structure of a semiconductor package and a manufacturing method of the same in embodiments according to the present invention will be described with reference to the drawings. The following embodiments are examples of the present invention, and the present invention is not construed as being limited to any of the embodiments. In the drawings referred to in this specification, components that are the same or have substantially the same functions as those shown in a previous drawing(s) bear the identical or similar reference signs thereto, and descriptions thereof may not be repeated. In the drawings, for the sake of illustration, the relative sizes may be different from the actual relative sizes, or a part of the structure may be omitted. For the sake of illustration, terms "above" and "below" may be used, but in the case where, for example, it is described that a first member is above a second member, the second member may be above the first member. In the following description, the phrase "first surface" or "second surface" used for a substrate does not refer to any specific surface of the substrate. The phrases "first surface" and the "second surface" are respectively used to specify the side of a top surface of the substrate and the side of a bottom surface of the substrate, namely, are used to specify the up-down direction with respect to the substrate.

Embodiment 1

With reference to FIG. 1, an overview of a semiconductor package 10 in embodiment 1 according to the present invention will be described in detail. FIG. 1 is a schematic cross-sectional view of the semiconductor package 10 in embodiment 1 according to the present invention.

(Structure of the Semiconductor Package 10)

As shown in FIG. 1, the semiconductor package 10 includes a support substrate 100, an adhesive layer 110, a semiconductor device 120, a first resin insulating layer 130, lines 140, a second resin insulating layer 150, and solder balls 160.

The support substrate 100 has a first surface 302 on which the semiconductor package 120 is located, a second surface 304 opposite to the first surface 302, and a side surface 310 between the first surface 302 and the second surface 304. The first surface 302 has a first end 306, and the second surface 304 has a second end 308. The side surface 310 connects the first end 306 and the second end 308 to each other, and is curved from the first end 306 toward the second end 308.

The second end 308 protrudes outward with respect to the support substrate 100 more than the first end 306. As described above, the side surface 310 is curved from the first end 306 toward the second end 308. As shown in FIG. 1, the side surface 310 has a curved shape having an inflection point 320 between the first end 306 and the second end 308. Namely, the side surface 310 is convexed outward with respect to the support substrate 100 on the side closer to the second surface 304 than the inflection point 320, and is concaved inward with respect to the support substrate 100 on the side closer to the first surface 302 than the inflection point 320. The first end 306 and an end of the adhesive layer 110 located on the first surface 302 are continuous to each other. In the case where the adhesive layer 110 is not located at the first end 306, the first end 306 and an end of the first resin insulating layer 130 may be continuous to each other.

The first surface 302 of the support substrate 100 is partially recessed to form the alignment markers 102. The adhesive layer 110 is located on the first surface 302 of the support substrate 100, and the adhesive layer 110 is partially opened to expose the alignment markers 102. The adhesive layer 110 has openings 112 formed therein, which are larger than the alignment markers 102. The openings 112 expose the alignment markers 102 and parts of the first surface 302 of the support substrate 100 that are around the alignment markers 102. The semiconductor device 120 is located on the adhesive layer 110. On the semiconductor 120, external terminals 122 connected with an electronic circuit included in the semiconductor device 120 are located. In the example shown in FIG. 1, the adhesive layer 110 is a single film layer. The adhesive layer 110 is not limited to having such a structure and may include a plurality of films.

The first resin insulating layer 130 is located on the support substrate 100 so as to cover the semiconductor device 120. The first resin insulating layer 130 has openings 132 formed therein. The openings 132 reach the external terminals 122. In other words, the openings 132 are provided so as to expose the external terminals 122.

The lines 140 include a first conductive layer 142 and a second conductive layer 144. The first conductive layer 142 is located on a top surface of the first resin insulating layer 130. The second conductive layer 144 is located on the first conductive layer 142 and in the openings 132, and is connected with the external terminals 122. In the example shown in FIG. 1, the first conductive layer 142 is located only on the first resin insulating layer 130, and is not located in the openings 132 at all. The semiconductor package 10 is not limited to having such a structure. For example, the first conductive layer 142 may be partially located in the openings 132. The first conductive layer 142 and the second conductive layer 144 may each be a single film layer as shown in FIG. 1, or alternatively, one of, or both of, the first conductive layer 142 and the second conductive layer 144 may include a plurality of films.

The second resin insulating layer 150 is located on the first resin insulating layer 130 so as to cover the lines 140. The second resin insulating layer 150 has openings 152 formed therein. The openings 152 reach the lines 140. In other words, the openings 152 are located so as to expose the lines 140.

The solder balls 160 are located in the openings 152 and on a top surface of the second resin insulating layer 150, and are connected with the lines 140. A surface of each of the solder balls 160 protrudes upward from the top surface of the second resin insulating layer 150. The protruding portion of each solder ball 160 is curved upward. The curved shape of each solder ball 160 may be arcked or parabolic as seen in a cross-sectional view.

(Materials of Components of the Semiconductor Package 10)

The materials of each of components (layers) included in the semiconductor package 10 shown in FIG. 1 will be described in detail.

The support substrate 100 may be formed of a metal material such as stainless steel (SUS), aluminum (Al), titanium (Ti), copper (Cu) or the like. Alternatively, the support substrate 100 may be formed of a semiconductor material such as silicon, silicon carbide, compound semiconductor or the like. It is preferable to use SUS for the support substrate 100 because SUS has a low coefficient of thermal expansion and costs low.

The adhesive layer 110 may be formed of an adhesive material containing an epoxy-based resin or an acrylic resin.

The semiconductor device 120 may be a central processing unit (CPU), a memory, a microelectromechanical system (MEMS) device, a semiconductor element for power (power device), or the like.

The first resin insulating layer 130 and the second resin insulating layer 150 may each be formed of polyimide, epoxy-based resin, polyimide resin, benzocyclobutene resin, polyamide, phenol resin, silicone resin, fluorocarbon resin, liquid crystal polymer, polyamideimide, polybenzoxazole, cyanate resin, aramid, polyolefin, polyester, BT resin, FR-4, FR-5, polyacetal, polybutyleneterephthalate, syndiotactic polystyrene, polyphenylenesulfide, polyetheretherketone, polyethernitrile, polycarbonate, polyphenyleneetherpolysulfone, polyethersulfone, polyarylate, polyetherimide, or the like. It is preferable to use an epoxy-based resin for the first resin insulating layer 130 and the second resin insulating layer 150 because the epoxy-based resin is superb in electric characteristics and processability.

The first resin insulating layer 130 used in this embodiment contains a filler. The filler may be an inorganic filler such as glass, talc, mica, silica, alumina or the like. The filler may be an organic filler such as a fluorocarbon resin filler or the like. The first resin insulating layer 130 does not need to contain a filler. In this embodiment, the second resin insulating layer 150 does not contain a filler. Alternatively, the second resin insulating layer 150 may contain a filler.

The first conductive layer 142 and the second conductive layer 144 may be formed of a metal material selected from copper (Cu), gold (Au), silver (Ag), platinum (Pt), rhodium (Rh), tin (Sn), aluminum (Al), nickel (Ni), palladium (Pd), chromium (Cr) and the like, and an alloy thereof. The first conductive layer 142 and the second conductive layer 144 may be formed of the same material or different materials.

The solder balls 160 may each of a spherical body formed of, for example, an Sn alloy containing a small amount of Ag, Cu, Ni, bismuth (Bi) or zinc (Zn) incorporated into Sn. Instead of the solder balls, general conductive particles may be used. For example, a particle formed of a resin and wrapped with a conductive film may be used as a conductive particle. Instead of the solder balls, a solder paste may be used. The solder paste may be formed of Sn, Ag, Cu, Ni, Bi, phosphorus (P), germanium (Ge), indium (In), antimony (Sb), cobalt (Co), lead (Pb) or the like.

(Manufacturing Method of the Semiconductor Package 10)

With reference to FIG. 2 through FIG. 23, a manufacturing method of the semiconductor package 10 in embodiment 1 according to the present invention will be described. A plurality of the semiconductor packages 10 are provided on the support substrate 100, which is a large metal substrate, and are separated from each other as individual semiconductor packages 10 in a final step. In the following description, one of the plurality of semiconductor packages 10 will be described as a representative example. In FIG. 2 through FIG. 23, the components that are the same as those shown in FIG. 1 bear the same reference signs. In the following description, a manufacturing method of the semiconductor package 10 using the support substrate 100 formed of SUS, the first resin insulating layer 130 formed of an epoxy-based resin, the first conductive layer 142 and the second conductive layer 144 formed of Cu, and the solder balls 160 formed of an Sn alloy will be described.

Figure 2:
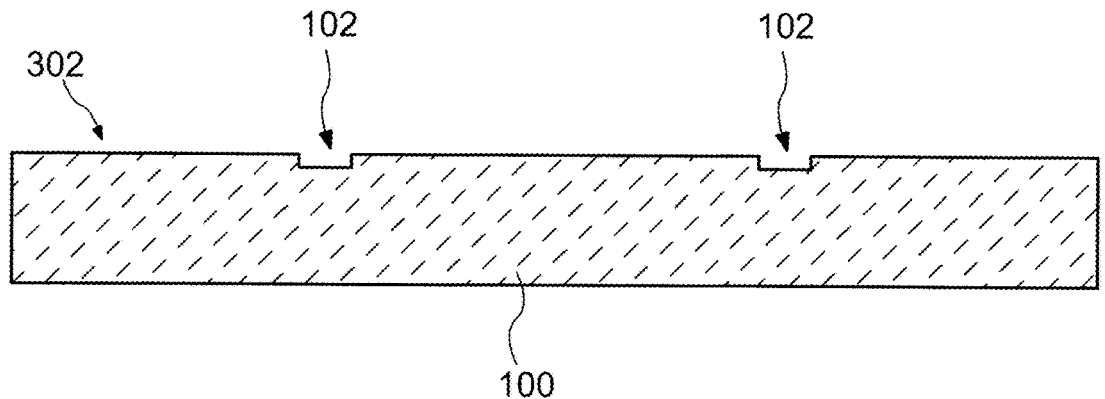
FIG. 2 shows a step of forming alignment markers in a support substrate in a manufacturing method of the semiconductor package in an embodiment according to the present invention.

FIG. 2 shows a step of forming the alignment markers 102 in the support substrate 100 in the manufacturing method of the semiconductor package 10 in embodiment 1 according to the present invention. The alignment markers 102 are formed in the first surface 302 of the support substrate 100 by photolithography and etching. The positions and the planar shape of the alignment markers 102 may be determined appropriately in accordance with the purpose of the semiconductor package 10. The alignment markers 102 may each have a stepped portion visually recognizable when the support substrate 100 is observed from above by an optical microscope or the like.

Figure 3:
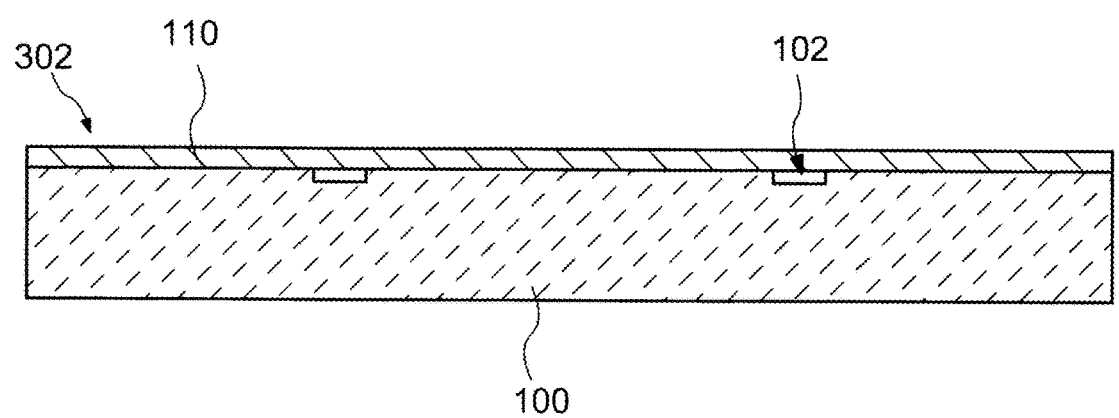
FIG. 3 shows a step of forming an adhesive layer on the support substrate in the manufacturing method of the semiconductor package in an embodiment according to the present invention.

FIG. 3 shows a step of forming the adhesive layer 110 on the support substrate 100 in the manufacturing method of the semiconductor package 10 in embodiment 1 according to the present invention. The adhesive layer 110 is formed on the first surface 302 of the support substrate 100 having the alignment markers 102 formed therein. As the adhesive layer 110, a sheet-like adhesive layer is bonded. Alternatively, a solvent containing an adhesive material dissolved therein may be applied on the support substrate 100 to form the adhesive layer 110. In the example shown in FIG. 3, recessed portions acting as the alignment markers 102 are hollow. Alternatively, the adhesive layer 110 may be formed to fill the recessed portions because such parts of the adhesive layer 110 that are in the alignment markers 102 will be removed in a later step.

Figure 4:
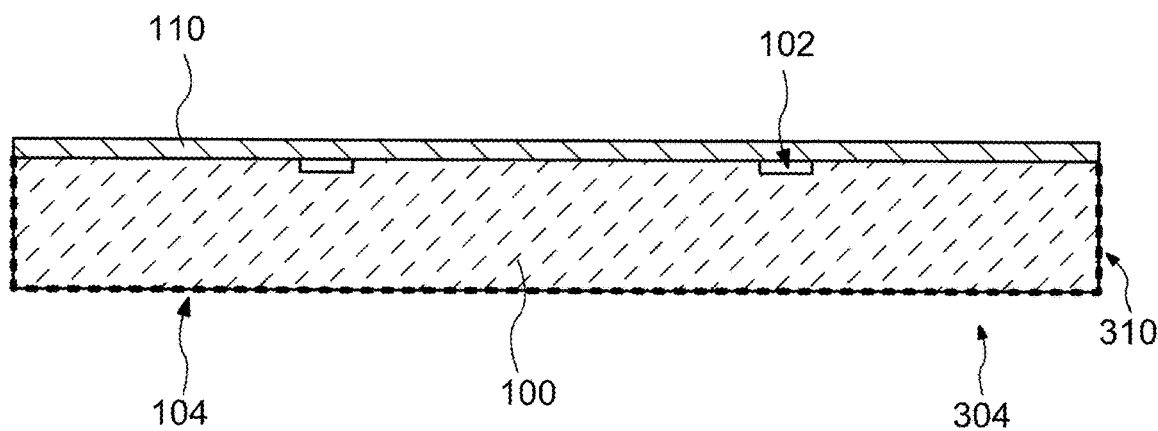
FIG. 4 shows a step of roughening a second surface and a side surface of the support substrate in the manufacturing method of the semiconductor package in an embodiment according to the present invention.

FIG. 4 shows a step of roughening the second surface and a side surface of the support substrate 100 in the manufacturing method of the semiconductor package 10 in embodiment 1 according to the present invention. The second surface 304 and the side surface 310 of the support substrate 100 are roughened for the purpose of suppressing a plating layer formed by electroless plating in a later step from being delaminated. The second surface 304 and the side surface 310 of the support substrate 100 may be roughened by use of a Cu-containing chemical (etchant). In FIG. 4, a region 104 that is roughened (roughened region 104) is represented by the dashed line.

The roughening of the support substrate 100 will be described in more detail. In the case where the support substrate 100 is formed of SUS, a surface of the SUS substrate is passivated. Cu ion contained in the etchant is replaced with at least one of Fe, Cr and Ni in the SUS substrate. The SUS substrate is etched by the replacement of the Cu ion with at least one of Fe, Cr and Ni. However, the etching on the SUS substrate progresses locally. Therefore, the SUS substrate is etched non-uniformly. As a result, the post-etching surface of the SUS substrate is highly rough. The SUS substrate is immersed in the etchant in the state shown in FIG. 4, so that the roughening of the second surface 304 and the side surface 310 of the SUS substrate is performed in the same step with the roughening of the first surface 302 of the SUS.

In this example, the SUS substrate is roughened after the adhesive layer 110 is bonded. The present invention is not limited to such a manufacturing method. For example, the SUS substrate may be roughened before the adhesive layer 110 is bonded, or before the alignment markers 102 are formed.

Figure 5:
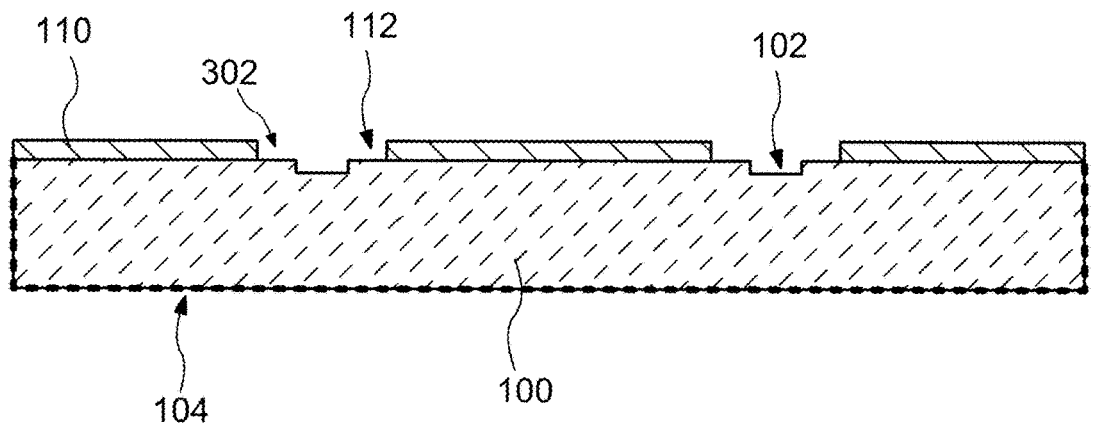
FIG. 5 shows a step of partially removing the adhesive layer in the manufacturing method of the semiconductor package in an embodiment according to the present invention.

FIG. 5 shows a step of partially removing the adhesive layer 110 in the manufacturing method of the semiconductor package 10 in embodiment 1 according to the present invention. In order to read the alignment markers 102 more precisely, parts of the adhesive layer 110 that are above the alignment markers 102 are removed to form the openings 112. The parts of the adhesive layer 110 may be removed by, for example, sublimation or ablation by laser irradiation. Alternatively, the openings 112 may be formed by photolithography and etching. The openings 112 are formed in regions larger than the alignment markers 102 in order to expose the alignment markers 102 with certainty. More specifically, the openings 112 expose parts of the first surface 302 of the support substrate 100. In other words, the openings 112 are each formed such that an outer edge thereof encloses an outer circumference of the corresponding alignment marker 102 as seen in a plan view.

Figure 6:
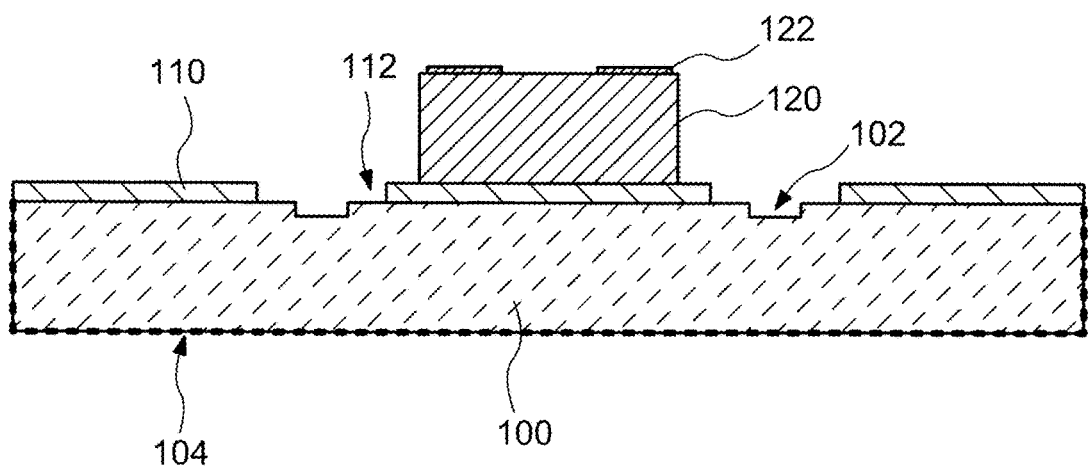
FIG. 6 shows a step of locating a semiconductor device on the support substrate in the manufacturing method of the semiconductor package in an embodiment according to the present invention.

FIG. 6 shows a step of locating the semiconductor device 120 on the support substrate 100 in the manufacturing method of the semiconductor package 10 in embodiment 1 according to the present invention. The semiconductor device 120 is positionally aligned with respect to the support substrate 100 by use of the alignment markers 102 exposed as described above, and the semiconductor device 120 having the external terminals 122 provided on a top surface thereof is located on the support substrate 100 with the adhesive layer 110 being provided between the semiconductor device 120 and the support substrate 100. In actuality, a plurality of the semiconductor devices 120 are located on one support substrate 100. In FIG. 6, one of the plurality of semiconductor devices 120 is shown as a representative example. The alignment markers 102 may be read by, for example, an optical microscope, a CCD camera, an electron microscope or the like. The semiconductor device 120 is mounted on the support substrate 100 with high alignment precision by this method.

Figure 7:
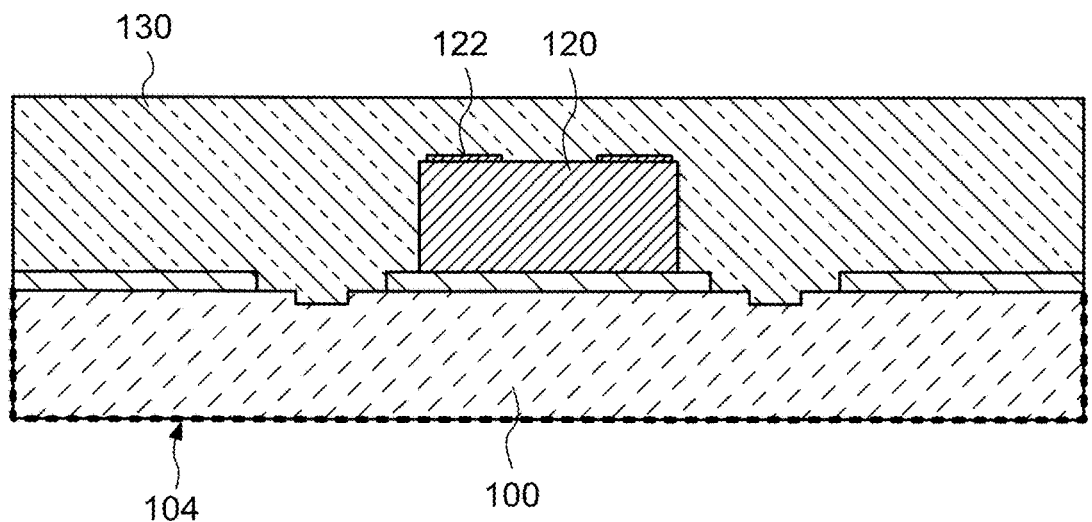
FIG. 7 shows a step of forming a first resin insulating layer in the manufacturing method of the semiconductor package in an embodiment according to the present invention.

FIG. 7 shows a step of forming the first resin insulating layer 130 in the manufacturing method of the semiconductor package 10 in embodiment 1 according to the present invention. The first resin insulating layer 130 is formed by bonding a sheet-like insulating film. Specifically, the sheet-like film is bonded to the support substrate 100 having the semiconductor device 120 mounted thereon, and then is melted by heating. The melted sheet-like film is caused to fill the recessed portions acting as the alignment markers 102 by pressurization. The first resin insulating layer 130 shown in FIG. 7 is formed of the sheet-like film by the heating and the pressurization. The first resin insulating layer 130 is set to have a thickness sufficient for the first insulating layer 130 to cover the semiconductor device 120. Namely, the thickness of the first insulating layer 130 is greater than the thickness (height) of the semiconductor device 120. The first resin insulating layer 130 alleviates (flattens) the stepped portions formed by the semiconductor device 120, the adhesive layer 110 and the like, and thus may be referred to as a "flattening film".

The first resin insulating layer 130 prevents connection of the semiconductor device 120 with the line 140 and connection of the external terminal 122 with the line 140 at the region other than the contact portion. Namely, there is a gap between the semiconductor device 120 and the line 140, and between the external terminal 122 and the line 140. As long as the first insulating layer 130 is located on at least a top surface and a side surface of the assembly of the semiconductor device 120 and the external terminals 122, the thickness of the first resin insulating layer 130 may be smaller than the thickness of the semiconductor device 120. In the example shown in FIG. 7, the first resin insulating layer 130 is formed by bonding a sheet-like film. The first resin insulating layer 130 is not limited to being formed by this method. For example, the first resin insulating layer 130 may be formed by any of various methods including spin-coating, dipping, ink-jetting, vapor deposition and the like.

Figure 8:
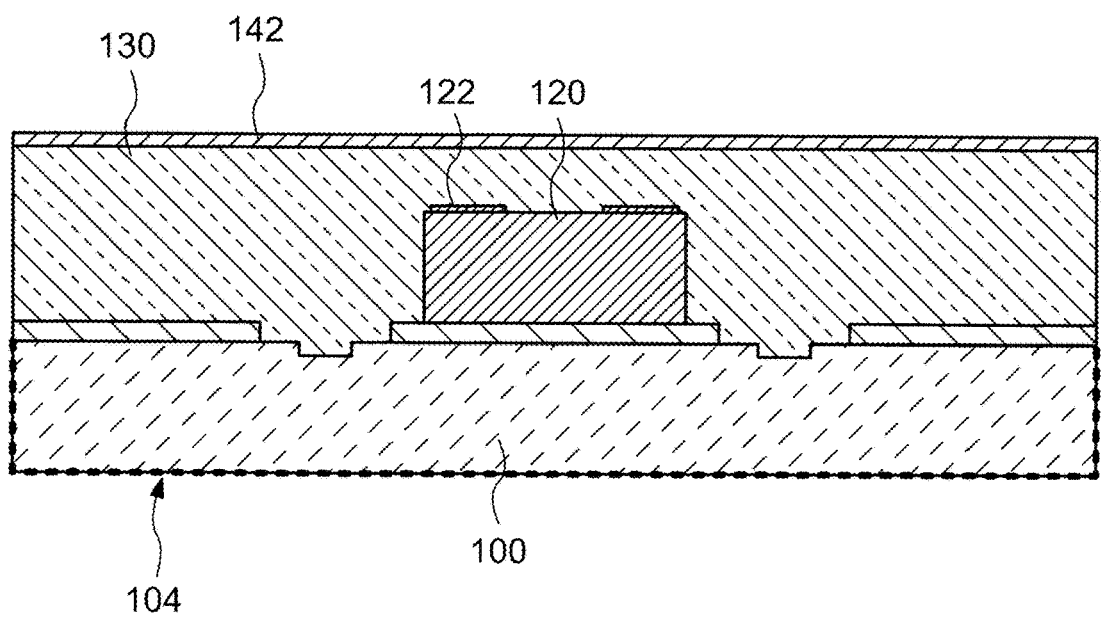
FIG. 8 shows a step of forming a first conductive layer on the first resin insulating layer in the manufacturing method of the semiconductor package in an embodiment according to the present invention.

FIG. 8 shows a step of forming the first conductive layer 142 on the first resin insulating layer 130 in the manufacturing method of the semiconductor package 10 in embodiment 1 according to the present invention. A sheet-like conductive film is bonded to the top surface of the first resin insulating layer 130. In other words, the conductive film is used as the first conductive layer 142. In this example, the first conductive layer 142 is formed by bonding a film. The first conductive layer 142 is not limited to being formed by this method. For example, the first conductive layer 142 may be formed by plating or physical vapor deposition (PVD). The PVD may be sputtering, vacuum vapor deposition, electron beam deposition, molecular beam epitaxy, or the like. Alternatively, a solvent containing a conductive resin material dissolved therein may be applied to form the first conductive layer 142.

Figure 9:
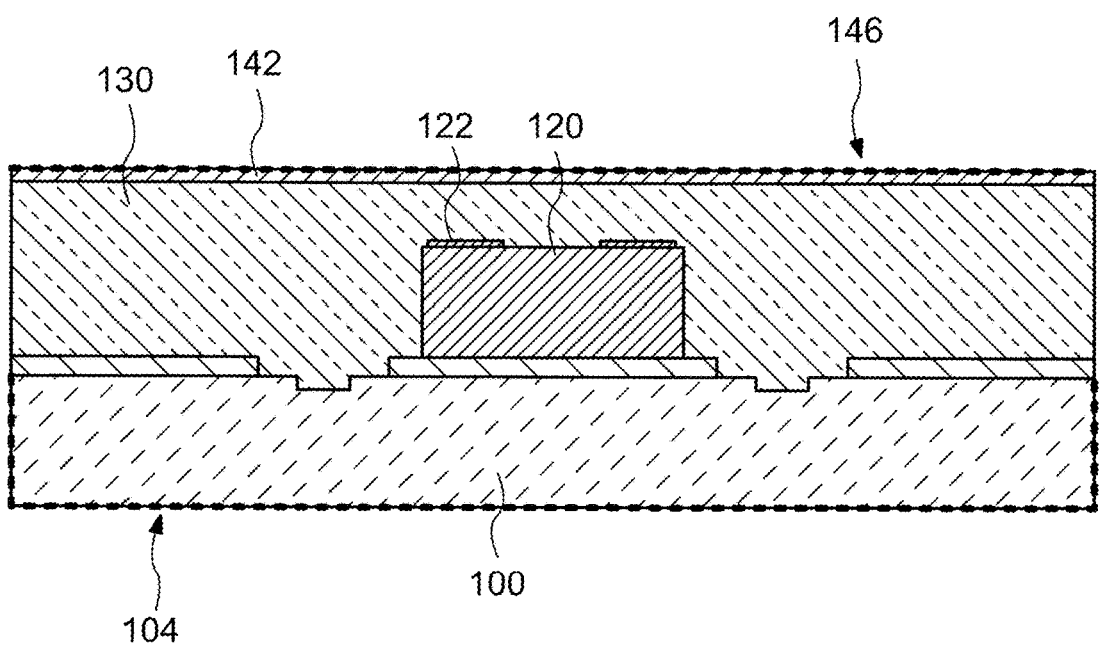
FIG. 9 shows a step of roughening a top surface of the first conductive layer in the manufacturing method of the semiconductor package in an embodiment according to the present invention.

FIG. 9 shows a step of roughening a top surface of the first conductive layer 142 in the manufacturing method of the semiconductor package 10 in embodiment 1 according to the present invention. As shown in FIG. 9, the top surface of the first conductive layer 142 formed on the first resin insulating layer 130 is roughened. The top surface of the first conductive layer 142 may be roughened by etching using a ferric chloride-containing etchant. In FIG. 9, a region 146 that is roughened (roughened region 146) is represented by the dashed line.

Figure 10:
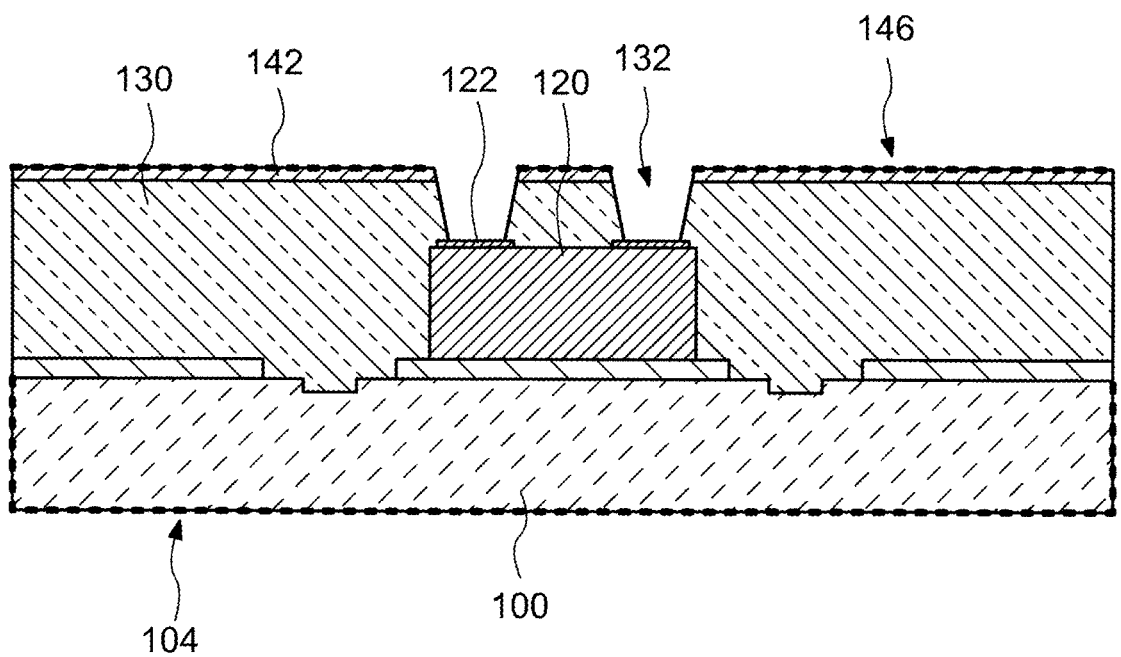
FIG. 10 shows a step of forming openings in the first resin insulating layer in the manufacturing method of the semiconductor package in an embodiment according to the present invention.

FIG. 10 shows a step of forming the openings 132 in the first resin insulating layer 130 in the manufacturing method of the semiconductor package 10 in embodiment 1 according to the present invention. As shown in FIG. 10, parts of the roughened region 146 in the top surface of the first conductive layer 142 that correspond to the external terminals 122 are irradiated with laser light to form the openings 132 exposing the external terminals 122. The openings 132 may be formed in the first conductive layer 142 and in the first resin insulating layer 130 in the same step. An example of the laser used to form the openings 132 is a $CO_2$ laser. The light generated by the $CO_2$ laser has the spot diameter and the energy amount thereof adjusted in accordance with the size of each opening 132, and is used to perform pulse irradiation a plurality of times. Since the top surface of the first conductive layer 142 has the roughened region 146, the energy of the laser light directed thereto is absorbed into the first conductive layer 142 efficiently. The laser light is directed toward a position inner to each of the external terminals 122. Namely, the laser light is directed so as not to expand beyond the pattern of the external terminals 122. In the case where a part of the semiconductor device 120 is to be processed, the laser light may be directed so as to partially expand beyond the external terminals 122 intentionally.

In the example shown in FIG. 10, a side wall of the first conductive layer 142 and a side wall of the first resin insulating layer 130 that are in each of the openings 132 are continuous to each other. The semiconductor package 10 is not limited to having such a structure. For example, in the case where the openings 132 are formed by laser irradiation, the first resin insulating layer 130 may retract in a planar direction of the support substrate 100 (direction in which the diameter of the openings 132 is enlarged) more than the first conductive layer 142. Namely, an end of the first conductive layer 142 may protrude into each opening 132 more than an end of the first resin insulating layer 130. In other words, the first conductive layer 142 may protrude like a canopy. In still other words, at the time when the openings 132 are formed, a bottom surface of the first conductive layer 142 may be partially exposed to the openings 132. In this case, the protruded portions of the first conductive layer 142 may be bent toward the outer terminals 122 in the openings 132.

Figure 11:
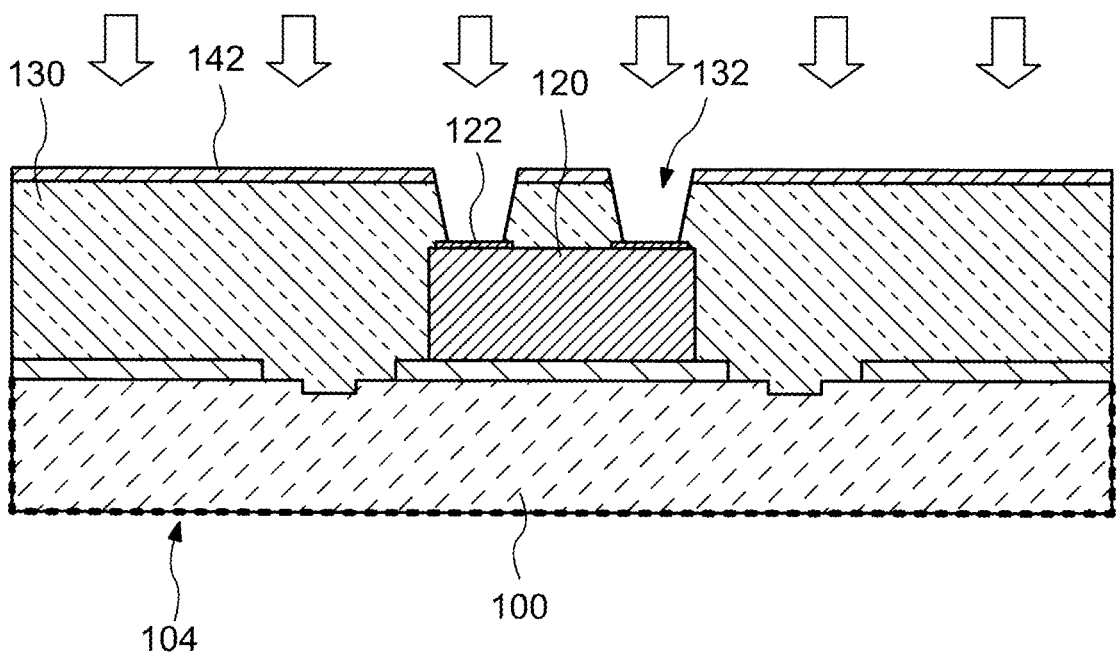
FIG. 11 shows a step of removing a roughened region of the first conductive layer and also removing residue on a bottom surface of each of the openings in the manufacturing method of the semiconductor package in an embodiment according to the present invention.

FIG. 11 shows a step of removing the roughened region 146 of the first conductive layer 142 and also removing residue on a bottom surface of each of the openings 132 in the manufacturing method of the semiconductor package 10 in embodiment 1 according to the present invention. After the openings 132 are formed, the roughened region 146 at the top surface of the first conductive layer 142 is first removed. The roughened region 146 may be removed by an acid treatment. After the roughened region 146 is removed, residue (smear) on the bottom surface of each opening 132 is removed. The removal of the residue (desmearing) is performed in two stages of plasma treatment and chemical treatment.

A method for removing the residue on the bottom surface of each opening 132 will be described in detail. First, the bottom surface of each opening 132 is subjected to a plasma treatment. The plasma treatment may be performed with plasma containing fluorine ($CF_4$) gas and oxygen ($O_2$) gas. The plasma treatment mainly removes parts of the first resin insulating layer 130 in the openings 132 that have not been removed by the formation of the opening 132. The plasma treatment also removes a quality-changed layer of the first resin insulating layer 130 generated by the formation of the openings 132. For example, in the case where the openings 132 are formed by laser irradiation, a layer of the first resin insulating layer 130 that is changed in quality by the energy of the laser light may remain on the bottom surfaces of the openings 132. The above-described plasma treatment removes such a quality-changed layer efficiently.

After the plasma treatment, a chemical treatment is performed. The chemical treatment may be performed with sodium permanganate or potassium permanganate. The chemical treatment removes the residue that has not been removed by the plasma treatment. For example, the filler contained in the first resin insulating layer 130 and has not been removed by the plasma treatment is removed. Sodium permanganate or potassium permanganate is an etchant having a role of etching the residue away. Before the treatment with the etchant, a swelling solution swelling the first resin insulating layer 130 may be used. After the treatment with the etchant, a neutralizing solution neutralizing the etchant may be used.

The use of the swelling solution expands a ring of resin and thus increases the wettability. This suppresses formation of a non-etched region. The use of the neutralizing solution allows the etchant to be removed efficiently, and thus suppresses an unintended progress of etching. For example, in the case where an alkaline chemical is used as the etchant, the etching may progress excessively in an unintended manner because the alkaline chemical is not easily removed by washing with water. Even in this case, the use of the neutralizing solution after the etching suppresses such an unintended progress of etching.

The swelling solution may be an organic solvent containing, for example, diethylene glycol monobutyl ether and ethylene glycol. The neutralizing solution may be a sulfuric acid-based chemical such as hydroxylamine sulfate or the like.

For example, in the case where an inorganic filler is contained in the first resin insulating layer 130, the filler may not be removed by the plasma treatment and remain as residue. Even in such a case, the chemical treatment performed after the plasma treatment removes the residue caused by the filler.

Figure 12:
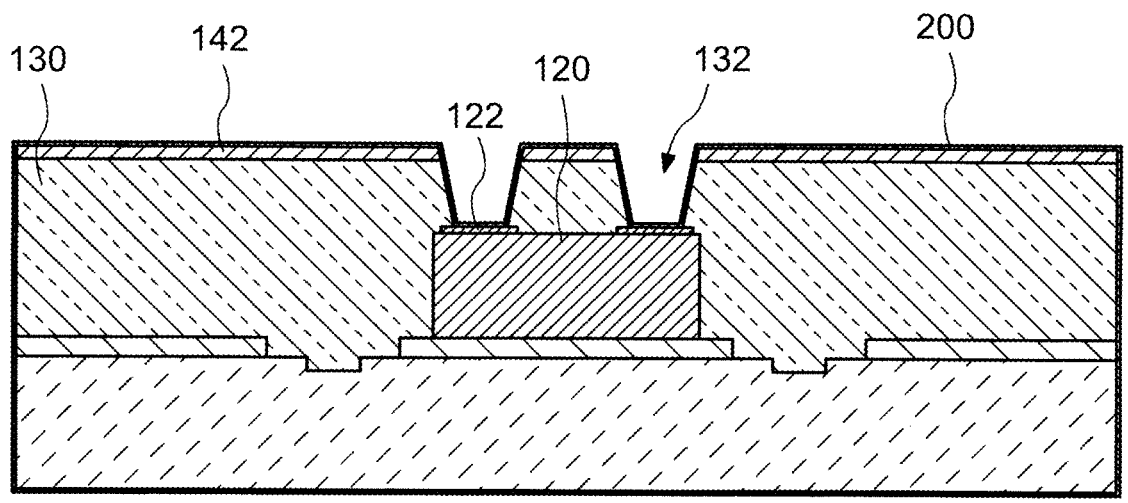
FIG. 12 shows a step of forming a conductive plating layer by electroless plating in the manufacturing method of the semiconductor package in an embodiment according to the present invention.

FIG. 12 shows a step of forming a conductive plating layer 200 by electroless plating in the manufacturing method of the semiconductor package 10 in embodiment 1 according to the present invention. The plating layer 200 (conductive body) to be connected with the external terminals 122 exposed after the above-described desmearing step is formed by electroless plating. According to the electroless plating, palladium colloid is adsorbed to a resin and immersed in a chemical solution containing Cu to replace Pd and Cu with each other, so that Cu is deposited. Since the plating layer 200 is formed by electroless plating after the roughened region 146 is removed, the adhesiveness of the plating layer 200 to the first conductive layer 142 is increased.

Figure 13:
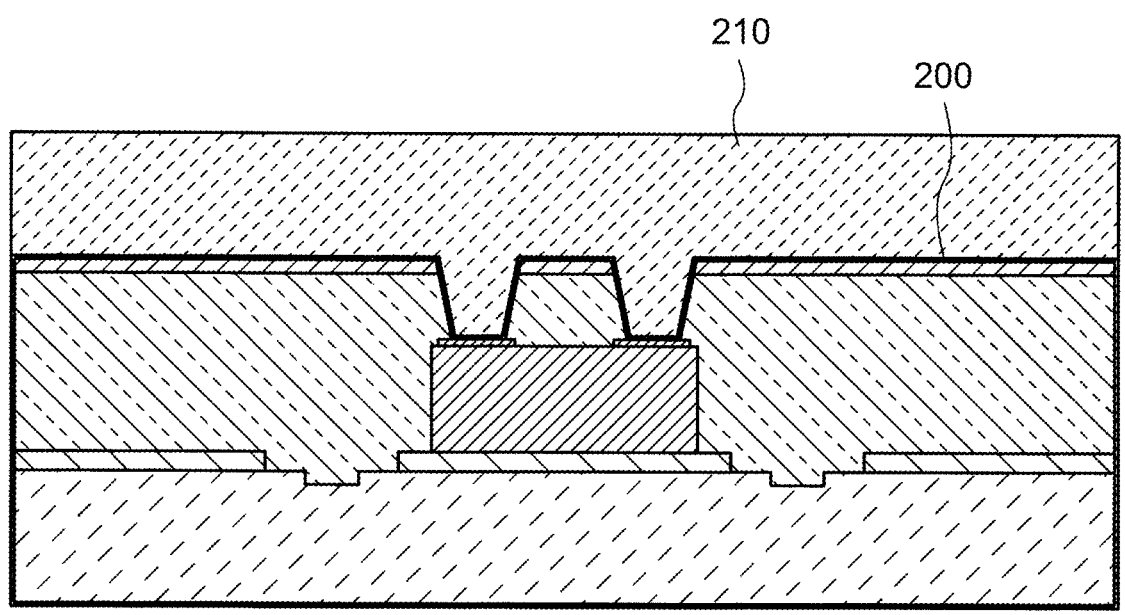
FIG. 13 shows a step of forming a photosensitive photoresist in the manufacturing method of the semiconductor package in an embodiment according to the present invention.

FIG. 13 shows a step of forming a photosensitive photoresist 210 in the manufacturing method of the semiconductor package 10 in embodiment 1 according to the present invention. As shown in FIG. 13, the photosensitive photoresist 210 is formed on the plating layer 200. The photosensitive photoresist 210 is formed by an application method such as spin-coating or the like. Before the photosensitive photoresist 210 is formed, a treatment to increase the adhesiveness between the plating layer 200 and the photosensitive photoresist 210 (hydrophobization surface treatment such as HMDS treatment or the like) may be performed. The photosensitive photoresist 210 may be of a negative type, in which case a region exposed to light is difficult to be etched by a developer, or may be of a positive type, in which case a region exposed to light is easily etched by a developer.

Figure 14:
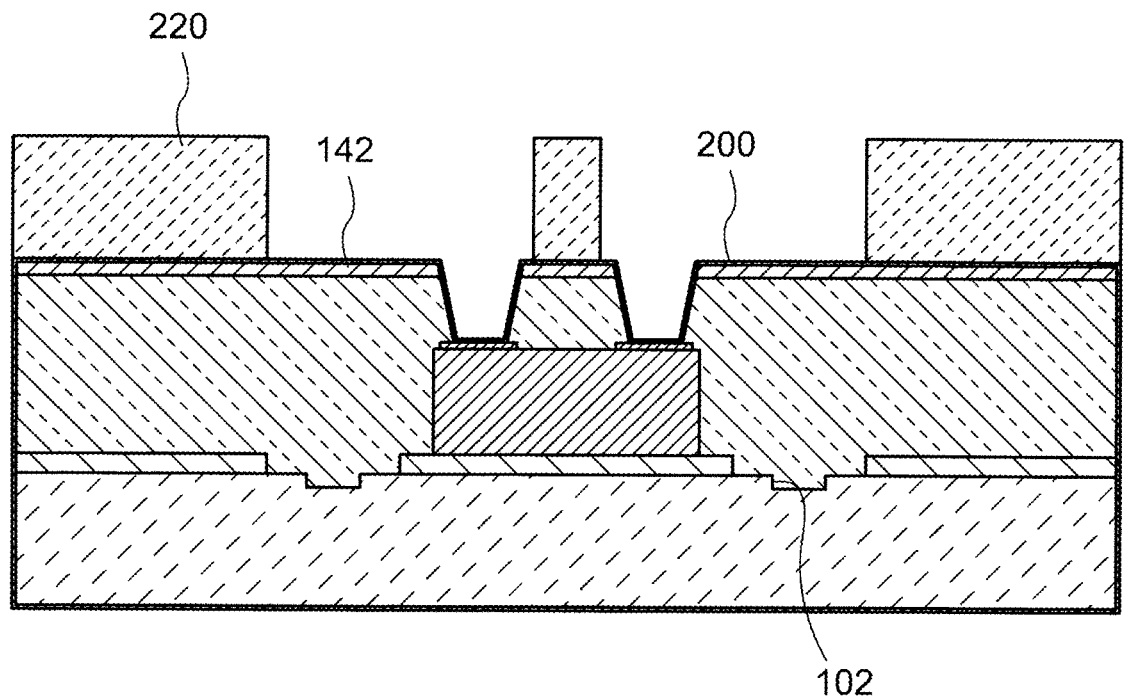
FIG. 14 shows a step of partially removing the photosensitive photoresist by photolithography in the manufacturing method of the semiconductor package in an embodiment according to the present invention.

FIG. 14 shows a step of partially removing the photosensitive photoresist 210 by photolithography in the manufacturing method of the semiconductor package 10 in embodiment 1 according to the present invention. As shown in FIG. 14, the photosensitive photoresist 210 applied in the previous step is exposed and developed, so that parts of the photosensitive photoresist 210 that correspond to regions where the lines 140 (FIG. 1) are to be formed are removed. As a result, a resist pattern 220 is formed. Before the photosensitive photoresist 210 is exposed to form the resist pattern 220, positional alignment is performed by use of the alignment markers 102 formed in the support substrate 100.

Figure 15:
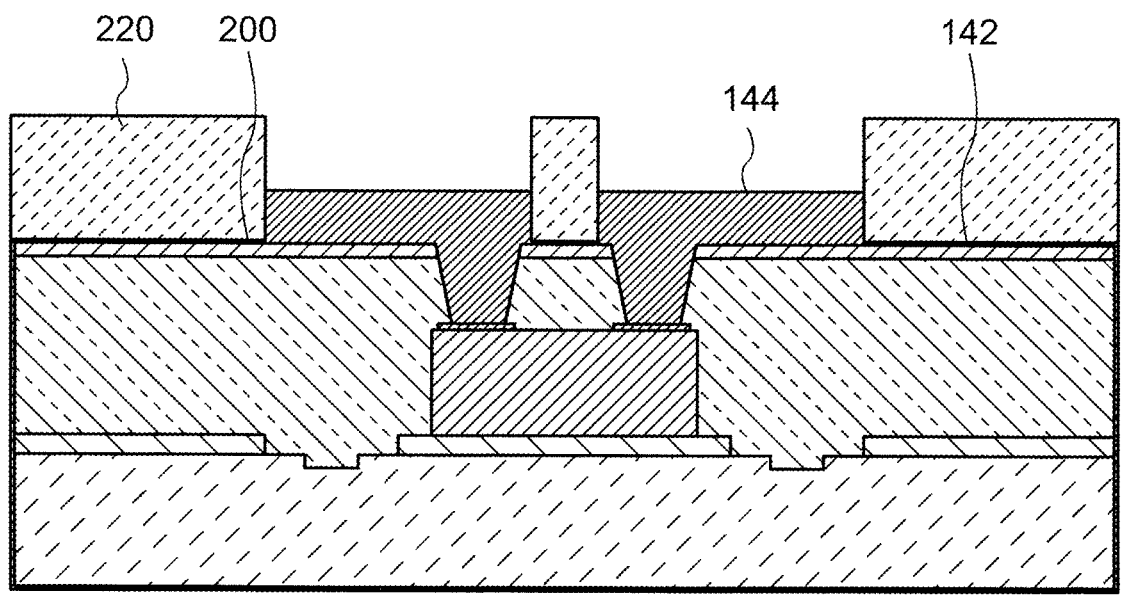
FIG. 15 shows a step of forming a second conductive layer by electroplating in the manufacturing method of the semiconductor package in an embodiment according to the present invention.

FIG. 15 shows a step of forming the second conductive layer 144 by electroplating in the manufacturing method of the semiconductor package 10 in embodiment 1 according to the present invention. After the resist pattern 220 is formed, the plating layer 200 formed by electroless plating is supplied with an electric current to perform electroplating, so that a part of the plating layer 200 that is exposed from the resist pattern 220 is grown to be thicker to form the second conductive layer 144. A part of the first conductive layer 142 and a part of the plating layer 200 that are below the resist pattern 220 will be removed when the entire surface is etched in a later step, and therefore, the thickness of the second conductive layer 144 will be also decreased. Thus, the thickness of the second conductive layer 144 is adjusted in consideration of the amount of the thickness that will be decreased in the later step.

Figure 16:
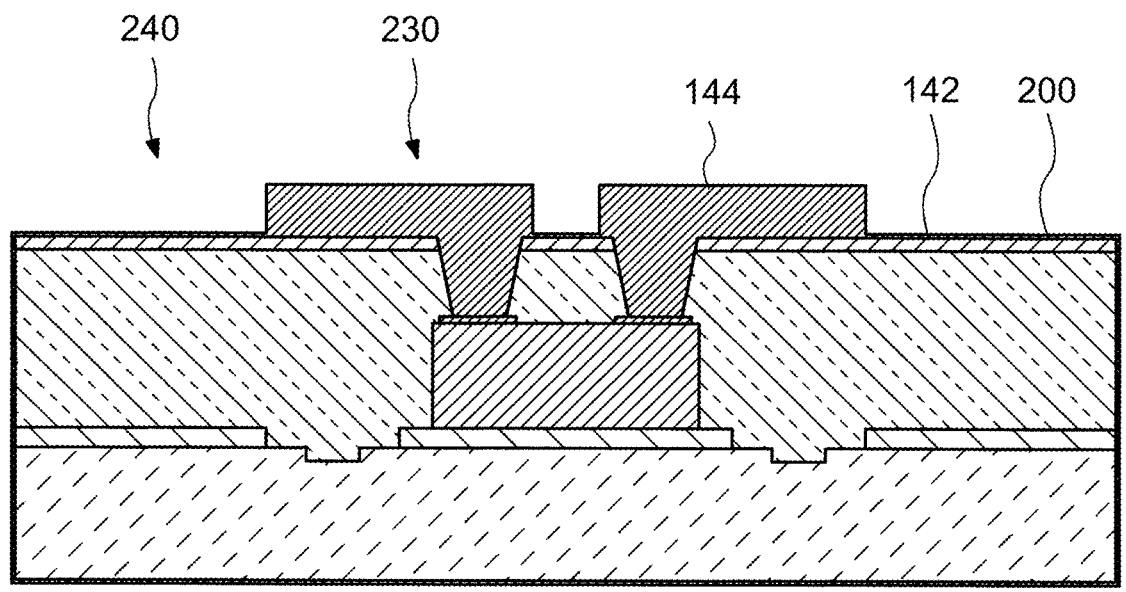
FIG. 16 shows a step of removing a resist pattern formed of the photoresist in the manufacturing method of the semiconductor package in an embodiment according to the present invention.

FIG. 16 shows a step of removing the resist pattern 220 formed of the photoresist in the manufacturing method of the semiconductor package 10 in embodiment 1 according to the present invention. As shown in FIG. 16, after the plating layer 200 is made thicker to form the second conductive layer 144, the photoresist forming the resist pattern 220 is removed by an organic solvent. The photoresist may be removed by ashing with oxygen plasma instead of by the organic solvent. As a result of the removal of the photoresist, a thick film region 230 including the second conductive layer 144 and a thin film region 240 including the plating layer 200 but not including the second conductive layer 144 are obtained. The thick film region 230 includes a thick plating layer generated as a result of the thickness of the plating layer 200 being increased by electroplating. Therefore, the second conductive layer 144 strictly includes two layers. However, FIG. 16 does not distinguish these two layers.

Figure 17:
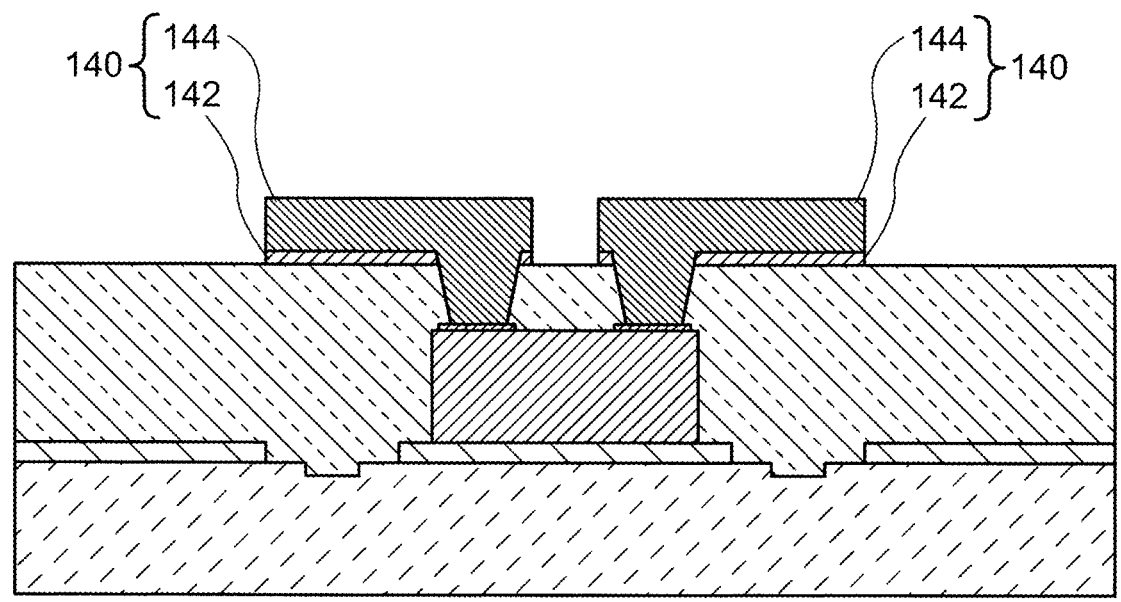
FIG. 17 shows a step of partially removing the second conductive layer to form lines in the manufacturing method of the semiconductor package in an embodiment according to the present invention.

FIG. 17 shows a step of partially removing the second conductive layer 144 to form the lines 140 in the manufacturing method of the semiconductor package 10 in embodiment 1 according to the present invention. As shown in FIG. 17, the part of the plating layer 200 and the part of the first conductive layer 142 that have not been thickened as a result of being covered with the resist pattern 220 are removed (etched away), so that the assembly of the first conductive layer 142 and the second conductive layer 144 is electrically divided into lines 140. The etching performed on the plating layer 200 and the first conductive layer 142 results in the second conductive layer 142 in the thick film region 230 being also etched from a top surface thereof and thus thinned. Therefore, it is preferable to set the original thickness of the second conductive layer 144 in consideration of the amount of thickness that is decreased in this step. The etching in this step may be wet etching or dry etching. In the example shown in FIG. 17, the lines 140, which have a one-layer structure, are formed. The semiconductor package 10 is not limited to being formed by this method. An insulating layer and a conductive layer may be stacked on the lines 140, so that a multiple-layer line including a plurality of line layers may be formed. In this case, each time a line layer is to be formed, an alignment marker may be formed to be used for positional alignment of the layers above the layers already formed.

Figure 18:
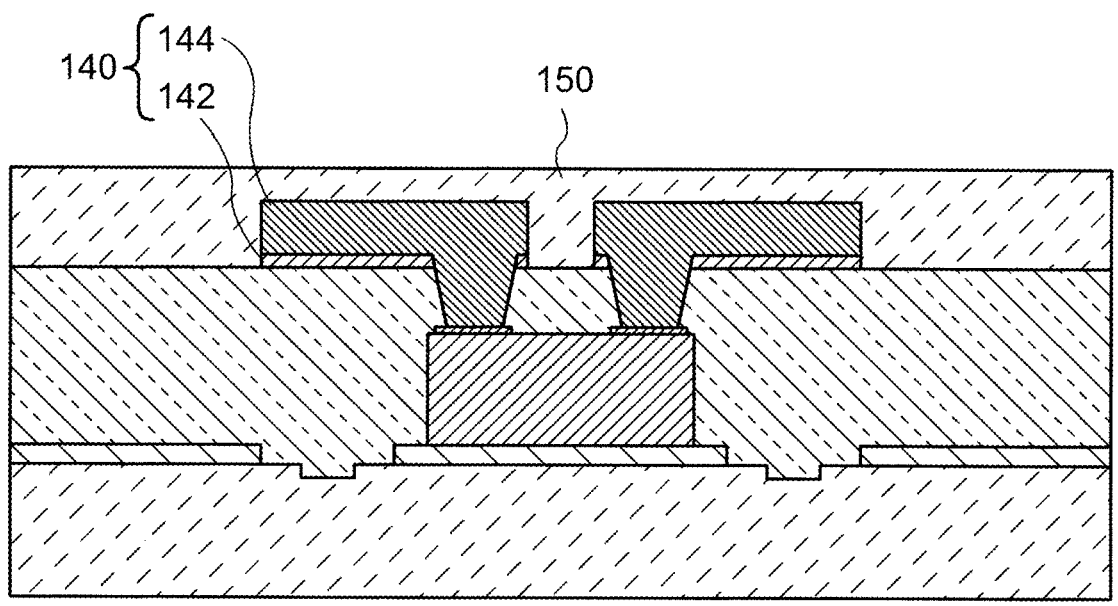
FIG. 18 shows a step of forming a second resin insulating layer covering the lines in the manufacturing method of the semiconductor package in an embodiment according to the present invention.

FIG. 18 shows a step of forming a second resin insulating layer 150 covering the lines 140 in the manufacturing method of the semiconductor package 10 in embodiment 1 according to the present invention. The second resin insulating layer 150 is formed by bonding a sheet-like insulating film and performing pressurization and heating on the sheet-like insulating film, like the first resin insulating layer 130. The second resin insulating layer 150 is set to have a thickness sufficient for the second insulating layer 150 to cover the lines 140. Namely, the thickness of the second insulating layer 150 is greater than the thickness of the lines 140. The second resin insulating layer 150 alleviates (flattens) the stepped portions formed by the lines 140 and the like, and thus may be referred to as a "flattening film".

The second resin insulating layer 150 prevents connection of the line 140 with the solder ball 160 at the region other than the contact portion. Namely, there is a gap between line 140 and the solder ball 160. As long as the second insulating layer 150 is located on at least a top surface and a side surface of each of the lines 140, the thickness of the second resin insulating layer 150 may be smaller than the thickness of the lines 140. In the example shown in FIG. 18, the second insulating layer 150 is formed by bonding a sheet-like film. The second resin insulating layer 150 is not limited to being formed by this method. For example, the second resin insulating layer 150 may be formed by any of various methods including spin-coating, dipping, ink-jetting, vapor deposition and the like.

Figure 19:
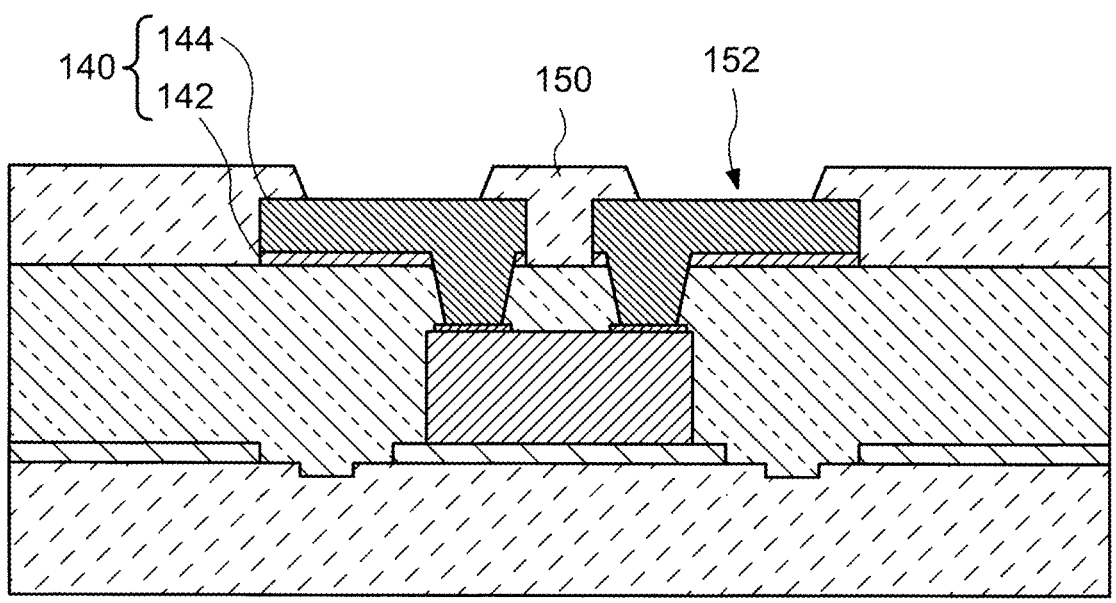
FIG. 19 shows a step of forming openings, exposing the lines, in the second resin insulating layer in the manufacturing method of the semiconductor package in an embodiment according to the present invention.

FIG. 19 shows a step of forming the openings 152, exposing the lines 140, in the second resin insulating layer 150 in the manufacturing method of the semiconductor package 10 in embodiment 1 according to the present invention. As shown in FIG. 19, the openings 152 exposing the lines 150 are formed in the second resin insulating layer 150. The openings 152 may be formed by photolithography and etching. In the case where the second resin insulating layer 150 is formed of a photosensitive resin, the openings 152 may be formed by exposure and development. The desmearing, which is performed on the openings 132 in the first resin insulating layer 130, may also be performed on the openings 152. Positional alignment may be performed to form the openings 152 by use of the alignment marker formed in the step of forming the lines 140.

Figure 20:
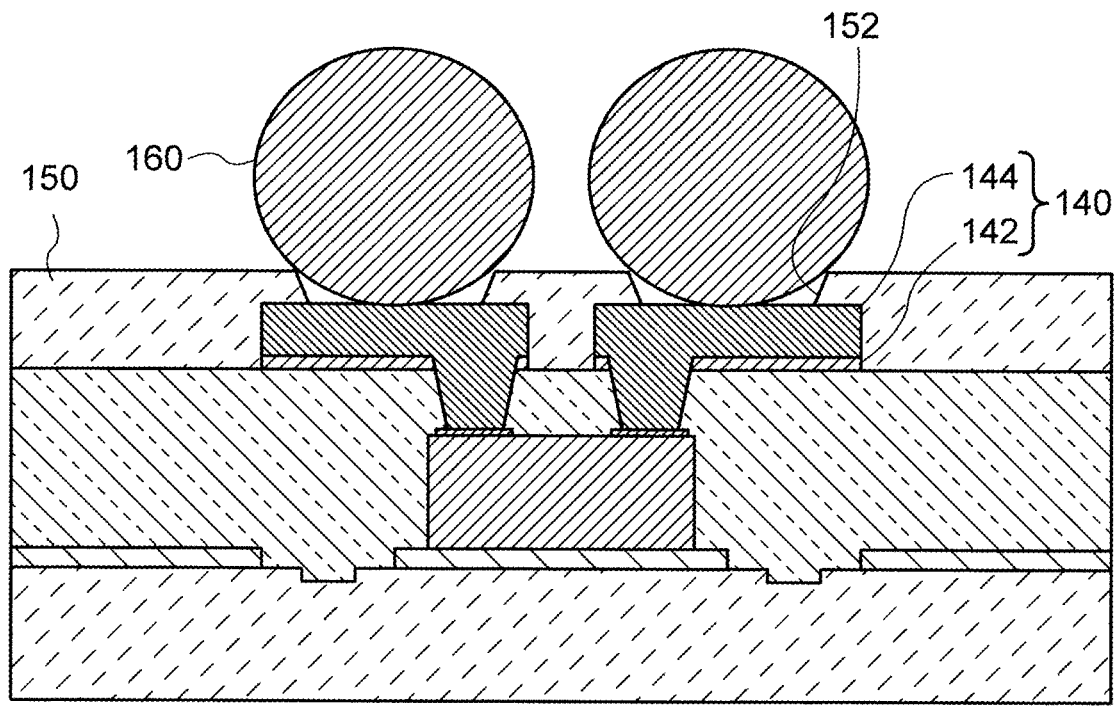
FIG. 20 shows a step of locating solder balls at positions corresponding to the exposed lines in the manufacturing method of the semiconductor package in an embodiment according to the present invention.

FIG. 20 shows a step of locating the solder balls 160 at positions corresponding to the exposed lines 140 in the manufacturing method of the semiconductor package 10 in embodiment 1 according to the present invention. As shown in FIG. 20, the solder balls 160 are located in the openings 152. In the example shown in FIG. 20, one solder ball 160 is located in one opening 152. The solder balls 160 are not limited to being located by this method. For example, a plurality of solder balls 160 may be located in one opening 152. In the example shown in FIG. 20, the solder balls 160 are in contact with the lines 140 on the stage where the solder balls 160 are located in the openings 152. The solder balls 160 are not limited to being located by this method. For example, the solder balls 160 may not be in contact with the lines 140 on the stage shown in FIG. 20. Positional alignment may be performed to locate the solder balls 160 by use of the alignment marker formed in the step of forming the lines 140.

Figure 21:
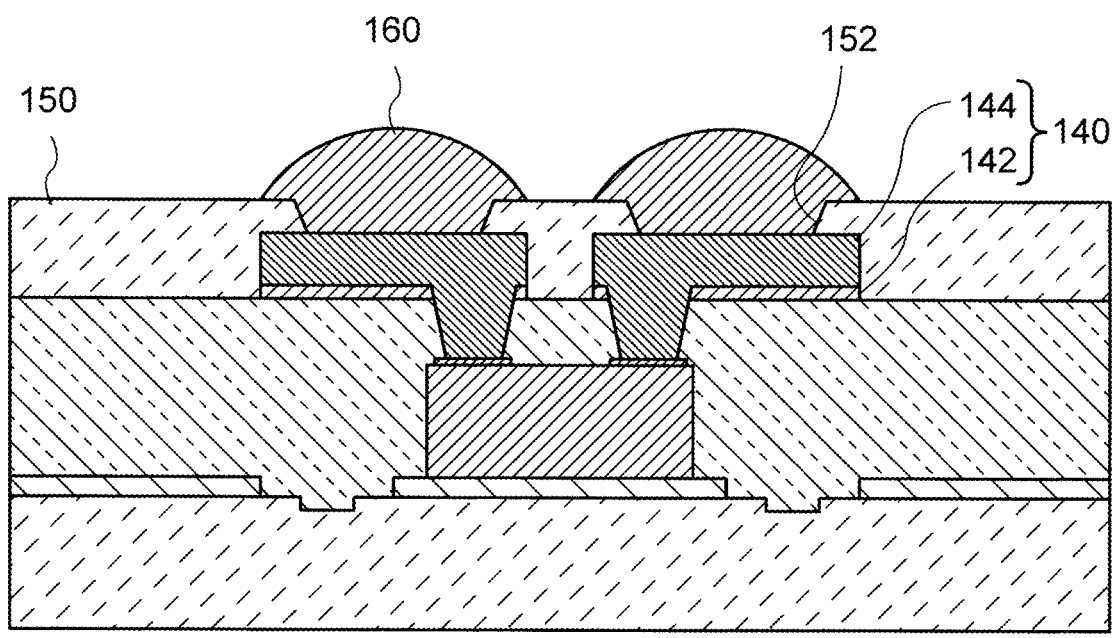
FIG. 21 shows a step of reflowing the solder balls in the manufacturing method of the semiconductor package in an embodiment according to the present invention.

FIG. 21 shows a step of reflowing the solder balls 160 in the manufacturing method of the semiconductor package 10 in embodiment 1 according to the present invention. Thermal treatment is performed in the state shown in FIG. 20 to reflow the solder balls 160. "Reflow" refers to liquefying at least a part of a solid target so as to fluidize the solid target and supplying the fluid target to a recessed portion. As a result of reflowing the solder balls 160, top surfaces of the lines 140 are entirely put into contact with the solder balls 160.

Figure 22:
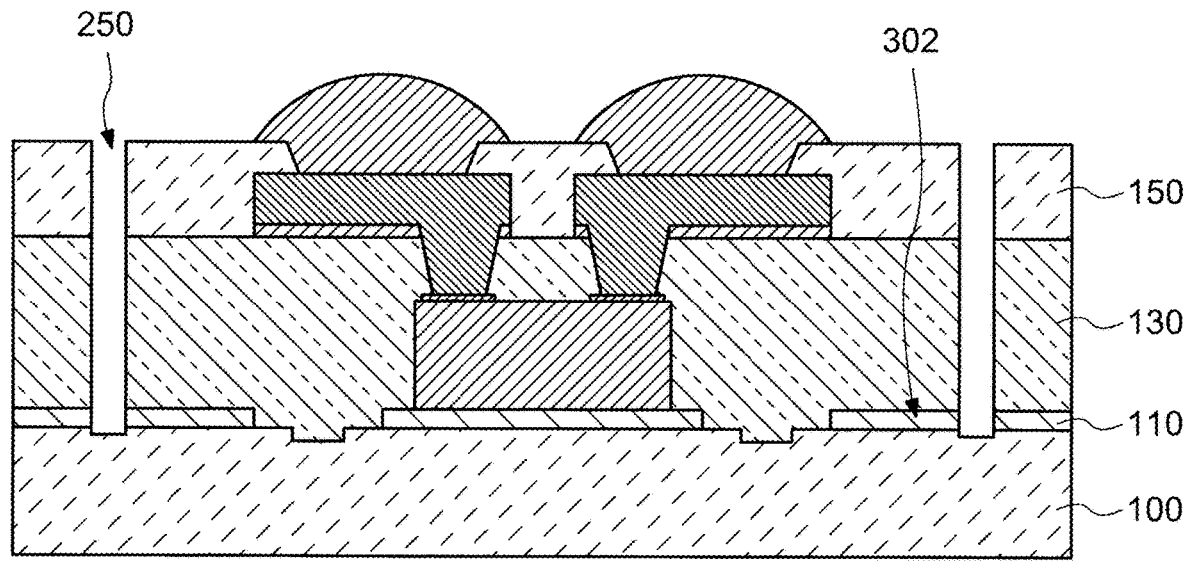
FIG. 22 shows a step of forming cuts (grooves) in the second resin insulating layer, the first resin insulating layer and the adhesive layer, so that the cuts reach the support substrate, in the manufacturing method of the semiconductor package in an embodiment according to the present invention.

FIG. 22 shows a step of forming first cuts (grooves 250) in the second resin insulating layer 150, the first resin insulating layer 130 and the adhesive layer 110, so that the first grooves 250 reach the support substrate 100, in the manufacturing method of the semiconductor package 10 in embodiment 1 according to the present invention. The first grooves 250 are formed by use of a dicing blade (e.g., circular grinding wheel formed of diamond abrasive grains) in the adhesive layer 110, the first resin insulating layer 130 and the second resin insulating layer 150 from the side of the first surface 302 of the support substrate 100. The first grooves 250 are formed so as to enclose each of the plurality of semiconductor devices 120 located on the support substrate 100 as seen in a plan view. For forming the first grooves 250, the above-described layers are cut by the dicing blade while the dicing blade is rotated at high speed and cooled with pure water and chips generated by the cutting is washed away with pure water. In the example shown in FIG. 22, the first grooves 250 are formed in the second resin insulating layer 150, the first resin insulating layer 130 and the adhesive layer 110 to reach the support substrate 100 by dicing. As a result, recessed portions are formed at the first surface 302 of the support substrate 100. Alternatively, dicing may be performed such that a part of the adhesive layer 110, or the adhesive layer 110 and a part of the first resin insulating layer 130, remain. Namely, the dicing may be performed such that the first grooves 250 do not reach the support substrate 100.

In order to form the first grooves 250, the dicing blade is caused to pass the above-described layers once. The dicing blade is moved at a rate of 10 mm/sec. while being rotated at high speed (40000 rpm). The dicing blade used here has a thickness of 0.15 mm, and the first grooves 250 formed by the dicing blade each have a width of 0.15 mm. The recessed portions formed in the first surface 302 of the support substrate 100 has a depth of about 0.1 mm. For the above-described dicing, the dicing blade may be caused to pass the above-described layers a plurality of times.

Figure 23:
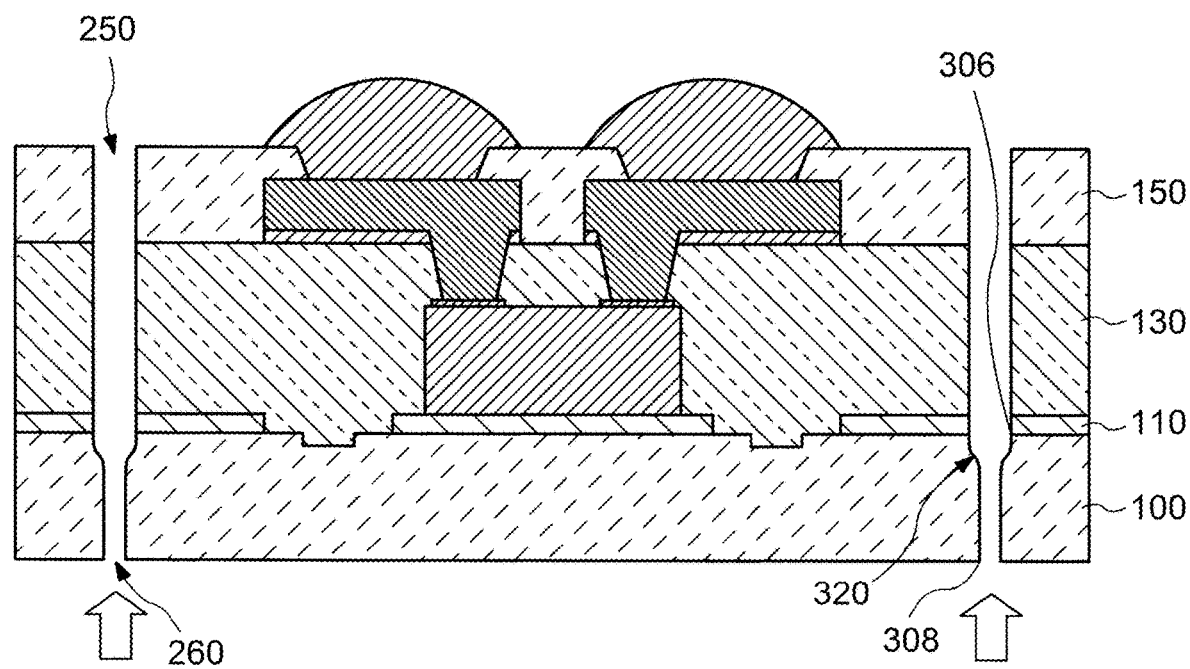
FIG. 23 shows a step of cutting the resultant assembly to form individual semiconductor packages in the manufacturing method of the semiconductor package in an embodiment according to the present invention.

FIG. 23 shows a step of cutting the resultant assembly to form individual semiconductor packages 10 in the manufacturing method of the semiconductor package 10 in embodiment 1 according to the present invention. As shown in FIG. 23, the second surface 304 of the support substrate 100 is irradiated with laser light to form second grooves 260 in positional correspondence with the first grooves 250. As a result, the plurality of semiconductor packages 10 are separated from each other as individual semiconductor packages 10. For irradiating the second surface 304, a high output laser generating light having a wavelength in an IR range may be used. Positional alignment may be performed for laser irradiation by use of the alignment markers 102 formed in the support substrate 100. The laser light is directed to a region smaller than each of the first grooves 250.

In order to form the second grooves 260 to separate the semiconductor packages 10 from each other, the laser beam is caused to pass the support substrate 100 once. The laser beam is moved (is caused to scan) at a rate of 600 mm/sec. for the laser irradiation. The laser beam has a diameter of 0.1 mmφ at a focal point at the second surface 304 of the support substrate 100. The second grooves 260 formed by the laser light having such a focal point diameter each have a width of 0.07 mm.

In the case where the second grooves 260 are formed by laser irradiation, the support substrate 100 is partially melted by the heat generated by the laser light. As a result, the surface of the support substrate 100 is smoothed. In the case where the second grooves 260 having a smaller width than that of the first grooves 250 are formed by laser irradiation, the stepped portions caused by the difference between the width of the first grooves 250 and the width of the second grooves 260 are smoothed. Namely, as shown in FIG. 23, a side wall of each first groove 250 and a side wall of the corresponding second groove 260 are continuous to each other in a curved manner. In other words, an inflection point is formed between the first end 306 in the vicinity of the first surface 302 and the second end 308.

In this example, the second surface 304 of the support substrate 100 is irradiated with laser light. The individual semiconductor packages 10 are not limited to being provided by this method. For example, the laser light may be directed from the side of the first surface 302 of the support substrate 100 through the first grooves 250. In this example, the laser light is directed to a region smaller than each first groove 250. The individual semiconductor packages 10 are not limited to being provided by this method. For example, the laser light may be directed to a region of an equal size to that of each first groove 250. Alternatively, the laser light may be directed to a region larger than each first groove 250.

In the case where the support substrate 100 is formed of a metal material, if the first grooves are formed throughout the assembly of the adhesive layer 110, the first resin insulating layer 130, the second resin insulating layer 150 and the support substrate 100 to divide the assembly into the semiconductor packages 10, the dicing blade is significantly abraded and thus the life of the dicing blade is shortened. If the support substrate 100 formed of a metal material is mechanically processed by the dicing blade, edges of the post-processing support substrate 100 may have burr having a sharp angle, which has a risk of injuring the worker at the time of dicing. In this embodiment, the first grooves 250 are mechanically formed with the dicing blade through the layers above the support substrate 100 and the support substrate is processed with laser light. Therefore, the abrasion of the dicing blade is suppressed, and the edges of the post-processing support substrate 100 are smoothed.

As described above, according to the manufacturing method of the semiconductor package 10 in embodiment 1, the support substrate 100 is irradiated with laser light after the first grooves 250 are formed in a resin insulating layer (the adhesive layer 110, the first resin insulating layer 130 and the second resin insulating layer 150). Therefore, for example, the dicing blade used to form the first grooves 250 is suppressed from being abraded. This allows the frequency of maintenance of the dicing blade to be decreased. In addition, the shape of the side surface 310 of the support substrate 100 is smoothed. This suppresses the other components from being damaged or protects the worker against injury. The manufacturing method in embodiment 1 according to the present invention provides the semiconductor package 10 allowing the frequency of maintenance thereof to be decreased.

Embodiment 2

Figure 24:
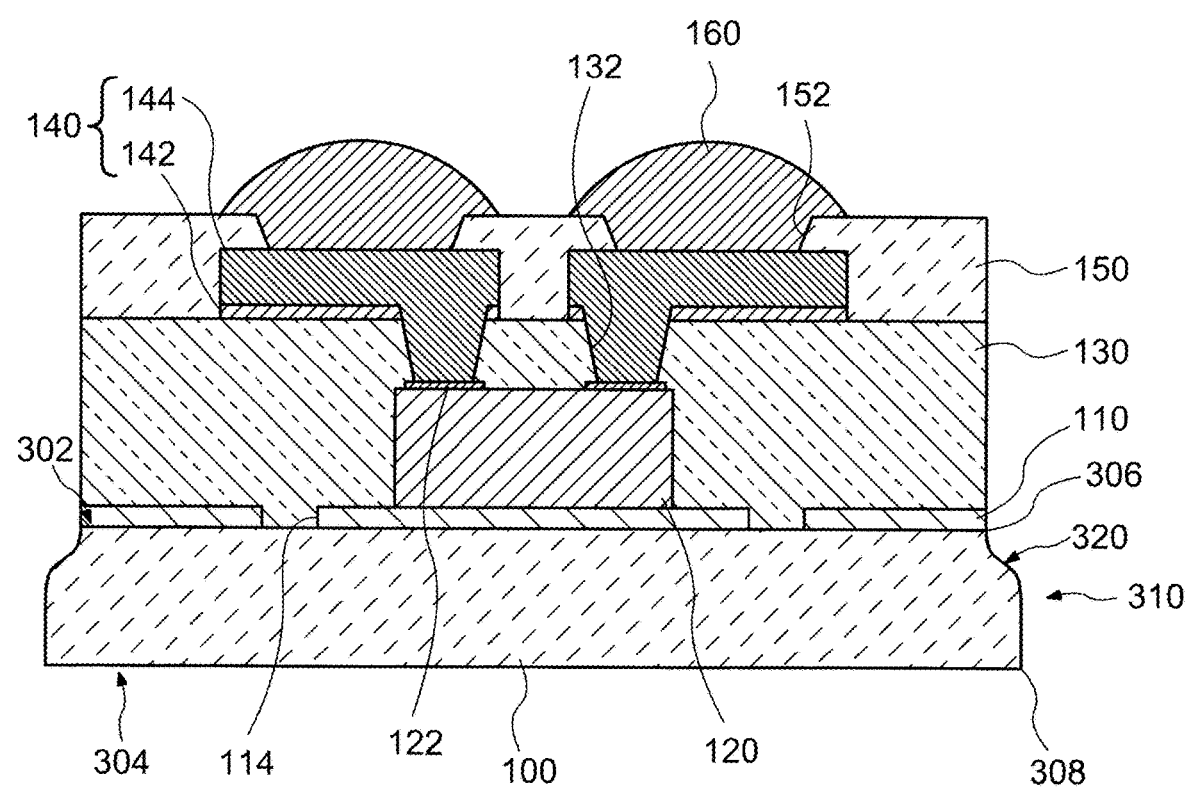
FIG. 24 is a schematic cross-sectional view of a semiconductor package in an embodiment according to the present invention.

With reference to FIG. 24, an overview of a semiconductor package 20 in embodiment 2 according to the present invention will be described in detail. FIG. 24 is a schematic cross-sectional view of the semiconductor package 20 in embodiment 2 according to the present invention.
(Structure of the Semiconductor Package 20).

The semiconductor package 20 in embodiment 2 is similar to the semiconductor package 10 in embodiment 1, but includes alignment markers 114 as openings formed in the adhesive layer 110 unlike the semiconductor package 10. In the semiconductor package 20, the support substrate 10 does not have any recessed portion formed therein. Alternatively, like the semiconductor package 10, the semiconductor package 20 may have a recessed portion formed in the first surface 302 of the support substrate 100 as an assisting alignment marker. The other components of the semiconductor package 20 are substantially the same as those of the semiconductor package 10, and thus will not be described in detail.
(Manufacturing Method of the Semiconductor Package 20)

With reference to FIG. 25 through FIG. 29, a manufacturing method of the semiconductor package 20 in embodiment 2 according to the present invention will be described. In FIG. 25 through FIG. 29, the same components as those shown in FIG. 24 bear the same reference signs. Like in embodiment 1, a manufacturing method of the semiconductor package 20 using the support substrate 100 formed of SUS, the first resin insulating layer 130 formed of an epoxy-based resin, the first conductive layer 142 and the second conductive layer 144 formed of Cu, and the solder balls 160 formed of an Sn alloy will be described.

Figure 25:
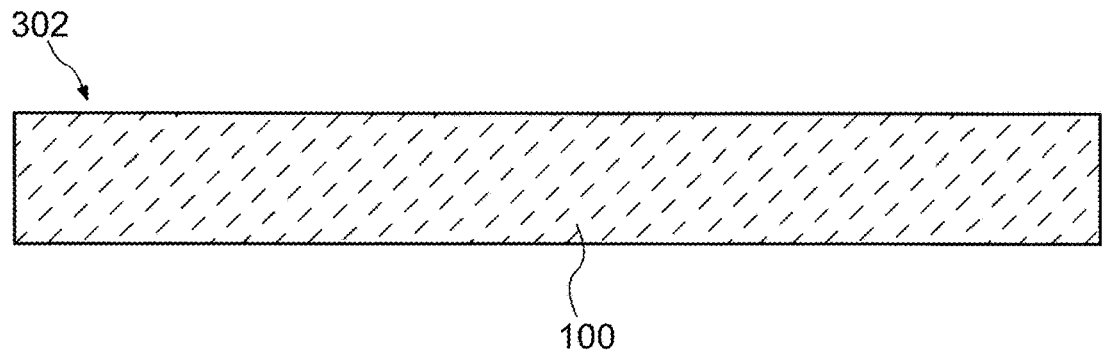
FIG. 25 shows a step of preparing a support substrate in the manufacturing method of the semiconductor package in an embodiment according to the present invention.

FIG. 25 shows a step of preparing the support substrate 100 in the manufacturing method of the semiconductor package 20 in embodiment 2 according to the present invention. In the manufacturing method of the semiconductor package 20, no alignment marker is formed in the first surface 302 of the support substrate 100. Alternatively, alignment markers may be formed like in the step shown in FIG. 2.

Figure 26:
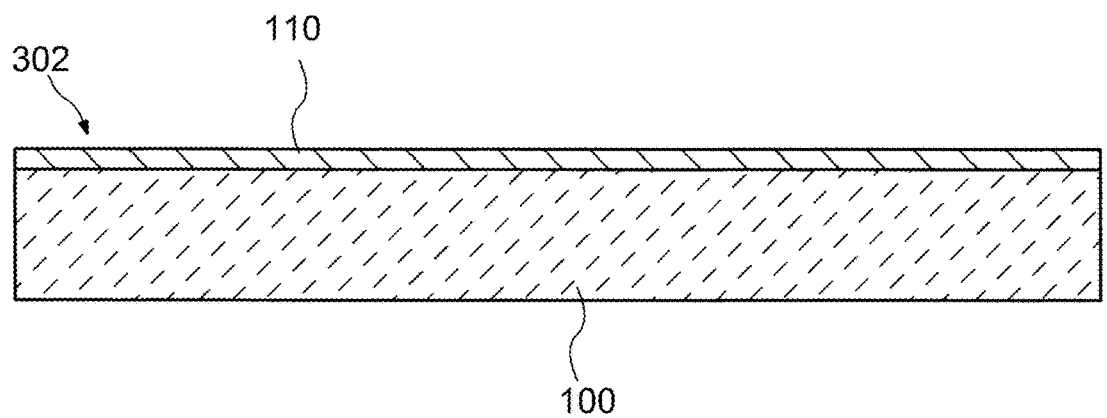
FIG. 26 shows a step of forming an adhesive layer on the support substrate in the manufacturing method of the semiconductor package in an embodiment according to the present invention.

FIG. 26 shows a step of forming the adhesive layer 110 on the support substrate 100 in the manufacturing method of the semiconductor package 20 in embodiment 2 according to the present invention. As shown in FIG. 26, the adhesive layer 110 is formed on the first surface 302 of the support substrate 100. As the adhesive layer 110, a sheet-like adhesive layer is bonded. Alternatively, an adhesive material dissolved in a solvent may be applied as the adhesive layer 110 on the support substrate 100.

Figure 27:
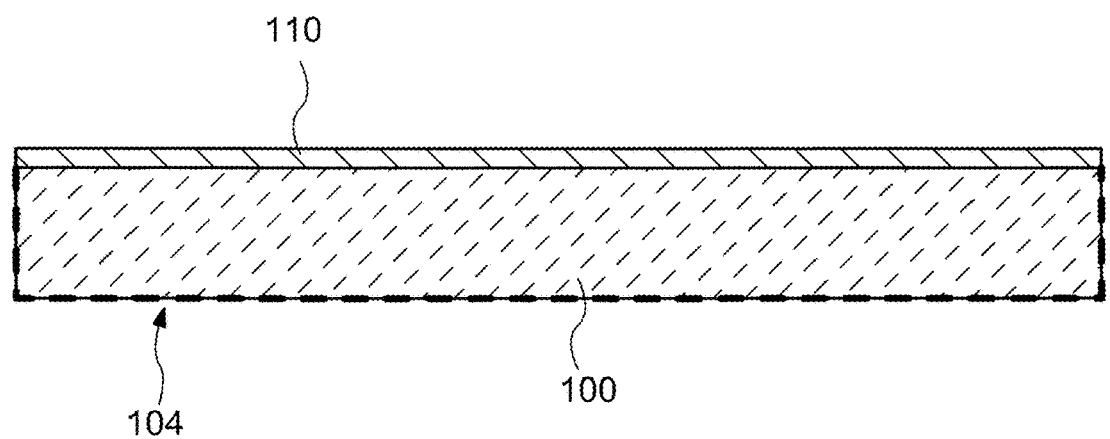
FIG. 27 shows a step of roughening a second surface and a side surface of the support substrate in the manufacturing method of the semiconductor package in an embodiment according to the present invention.

FIG. 27 shows a step of roughening the second surface 304 and the side surface 310 of the support substrate 100 in the manufacturing method of the semiconductor package 20 in embodiment 2 according to the present invention. The second surface 304 and the side surface 310 of the support substrate 100 are roughened for the purpose of suppressing a plating layer formed by electroless plating in a later step from being delaminated. The second surface 304 and the side surface 310 of the support substrate 100 may be roughened by use of a Cu-containing chemical (etchant). In FIG. 27, a region 104 that is roughened (roughened region 104) is represented by the dashed line.

In this example, the support substrate 100 formed of SUS is roughened after the adhesive layer 110 is bonded. The present invention is not limited to such a manufacturing method. For example, the support substrate 100 formed of SUS may be roughened before the adhesive layer 110 is bonded.

Figure 28:
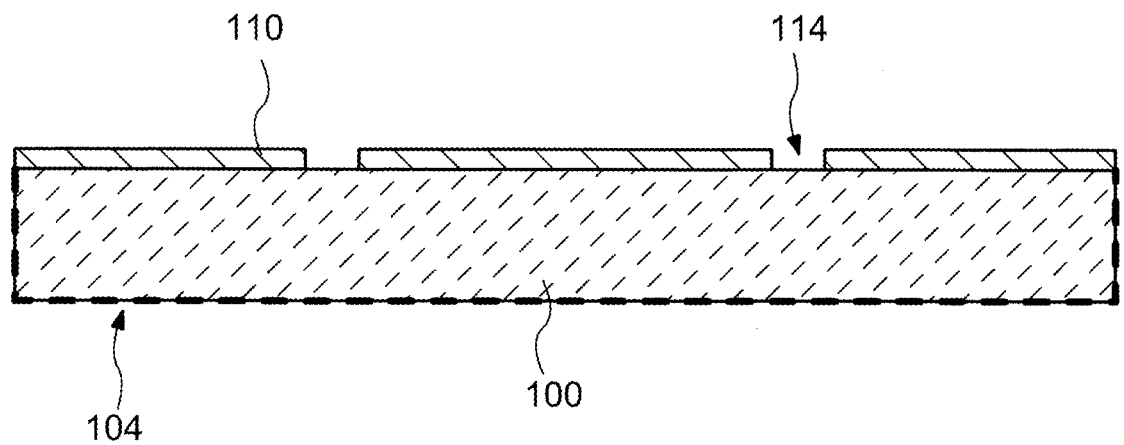
FIG. 28 shows a step of forming alignment markers in the adhesive layer in the manufacturing method of the semiconductor package in an embodiment according to the present invention.

FIG. 28 shows a step of forming the alignment markers 114 in the adhesive layer 110 in the manufacturing method of the semiconductor package 20 in embodiment 2 according to the present invention. The alignment markers 114 are formed by photolithography and etching. The positions and the planar shape of the alignment markers 114 may be determined appropriately in accordance with the purpose of the semiconductor package 20. The alignment markers 114 may each have a stepped portion visually recognizable when the support substrate 100 is observed from above by an optical microscope or the like. More specifically, in the example shown in FIG. 28, the alignment markers 114 are openings formed in the adhesive layer 110. Alternatively, the alignment markers 114 may be recessed portions (holes with a bottom surface) formed in the adhesive layer 110. In this step, an opening or a recessed portion different from the alignment markers 114 may be formed in the adhesive layer 110. The opening or the recessed portion different from the alignment markers 114 may be removed by sublimation or ablation by laser irradiation. Alternatively, the opening or the recessed portion may be removed by photolithography and etching.

Figure 29:
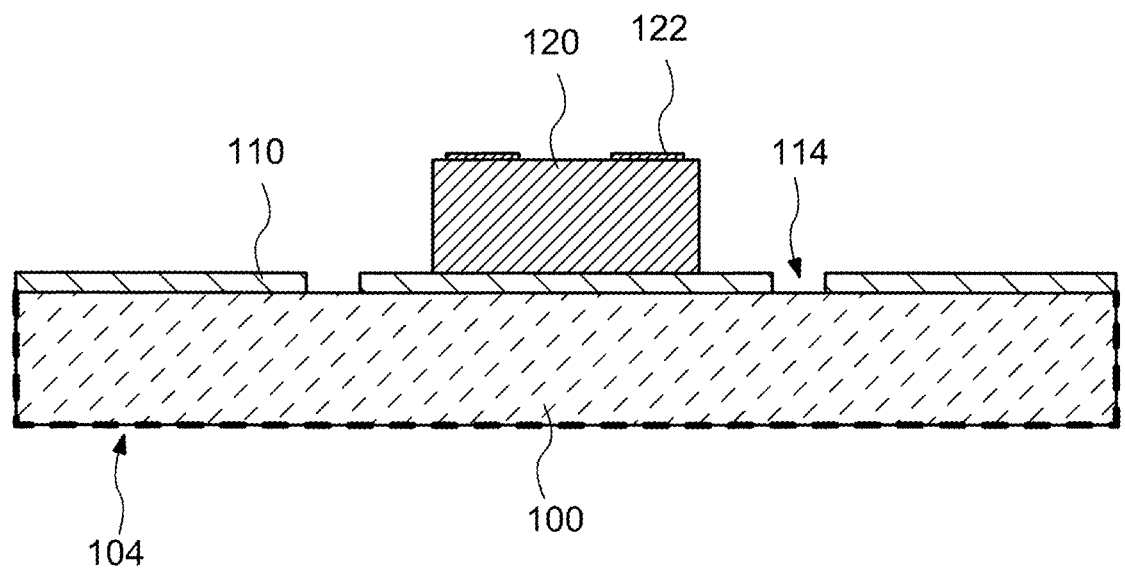
FIG. 29 shows a step of locating a semiconductor device on the support substrate in the manufacturing method of the semiconductor package in an embodiment according to the present invention.

FIG. 29 shows a step of locating the semiconductor device 120 on the support substrate 100 in the manufacturing method of the semiconductor package 20 in embodiment 2 according to the present invention. The semiconductor device 120 is positionally aligned with respect to the support substrate 100 by use of the alignment markers 114 formed in the adhesive layer 110 as described above, and the semiconductor device 120 having the external terminals 122 provided on a top surface thereof is located on the support substrate 100 with the adhesive layer 110 being provided between the semiconductor device 120 and the support substrate 100. The alignment markers 114 may be read by, for example, an optical microscope, a CCD camera, an electron microscope or the like. The semiconductor device 120 is mounted on the support substrate 100 with high alignment precision by this method.

The steps after the above step may be performed in substantially the same manner as shown in FIG. 7 through FIG. 23, and thus will not be described.

EXAMPLE

Hereinafter, observation results on an optical microscopic image in an example of the manufacturing method of the semiconductor package in an embodiment according to the present invention will be described. Specifically, an individual semiconductor package manufactured by the manufacturing method in an embodiment according to the present invention as shown in FIG. 22 and FIG. 23, and an individual semiconductor package manufactured in a comparative example, were compared with each other.

Figure 30A:
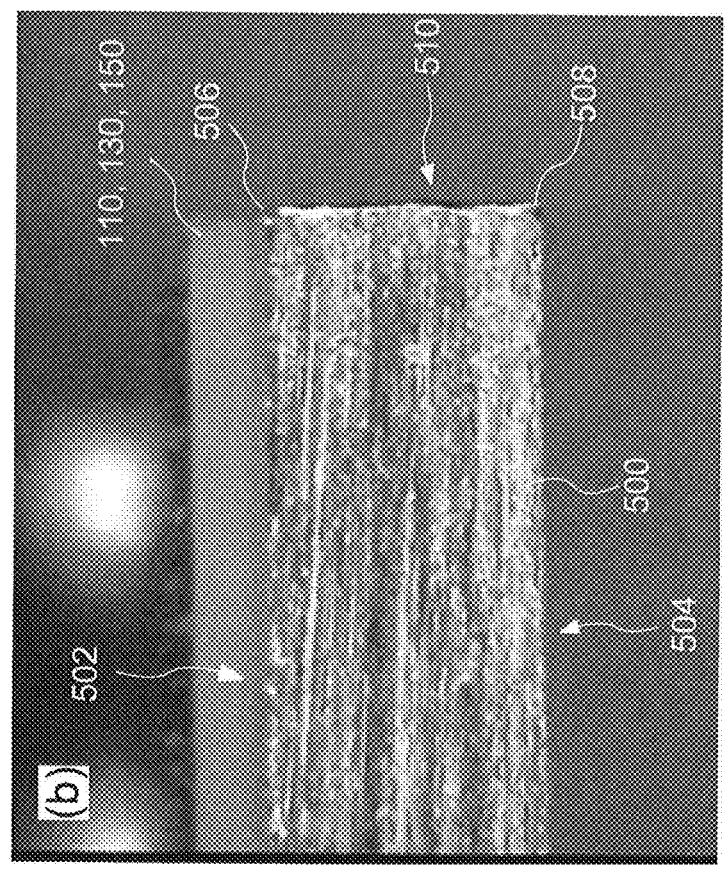
FIG. 30A shows an optical microscopic image showing a shape of a side surface of a support substrate in an example according to the present invention.
Figure 30B:
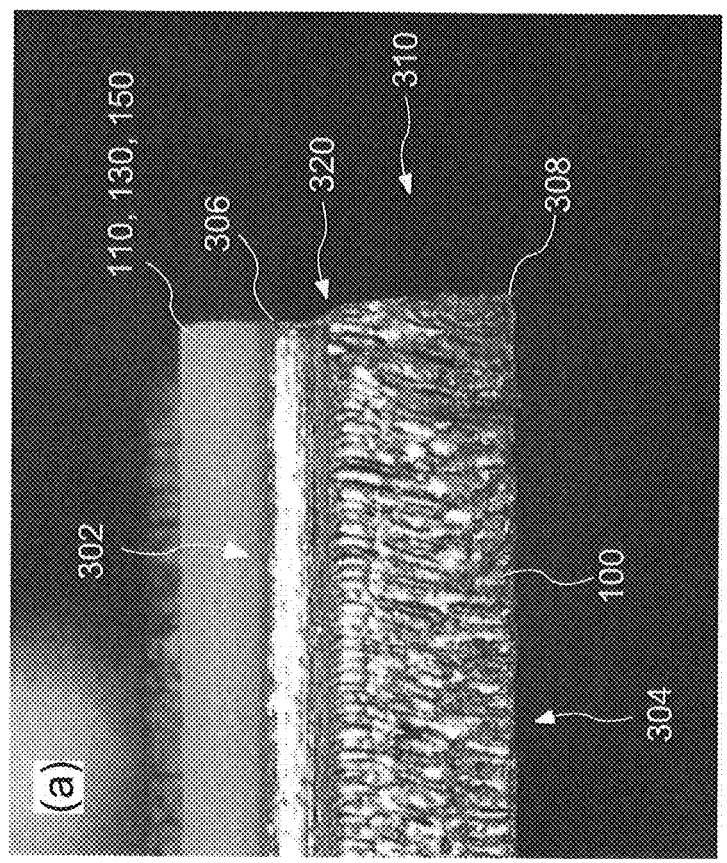
FIG. 30B shows an optical microscopic image showing a shape of a side surface of a support substrate in a comparative example.

FIG. 30A shows an optical microscopic image showing a shape of the side surface 310 of the support substrate 100 in an example according to the present invention. FIG. 30B shows an optical microscopic image showing a shape of a side surface 510 of a support substrate 500 in a comparative example. FIG. 30A shows a sample of the individual semiconductor package 10 in example (a) obtained as a result of two stages, namely, dicing performed on the resin insulating layer (the adhesive layer 110, the first resin insulating layer 130 and the second resin insulating layer 150), and laser irradiation performed on the support substrate 100. FIG. 30B shows a sample of a semiconductor device in comparative example (b) obtained as a result of dicing performed on the adhesive layer 110, the first resin insulating layer 130, the second resin insulating layer 150 and the support substrate 100 in one, same step.

The semiconductor package in example (a) shown in FIG. 30A was obtained as follows. A dicing blade was caused to pass, once, the resin insulating layer (the adhesive layer 110, the first resin insulating layer 130 and the second resin insulating layer 150) at a rate of 10 mm/sec. to form the first grooves 250 in the resin insulating layer. The grooves 250 were formed so as to reach the support substrate 100, and as a result, recessed portions each having a depth of about 0.1 mm were formed in the first surface 302 of the support substrate 100. After the above-described dicing, the second surface 304 of the support substrate 100 was irradiated with laser light. A laser beam was caused to pass, once, the support substrate 100 at a rate of 600 mm/sec. to form the second grooves 260 in the support substrate 100. In this manner, the semiconductor package 10 in example (a) was obtained.

The semiconductor package in comparative example (b) shown in FIG. 30B was obtained as follows. A dicing blade was caused to pass, once, the resin insulating layer (the adhesive layer 110, the first resin insulating layer 130 and the second resin insulating layer 150) and the support substrate 100 at a rate of 5 mm/sec. to cut the resin insulating layer and the support substrate 100 in one, same step. In this manner, the semiconductor package in comparative example (b) was obtained.

As the laser, a high output laser generating light having a wavelength in an IR range was used.

As shown in FIG. 30A, in example (a), the support substrate 100 and the resin insulating layer (the adhesive layer 110, the first resin insulating layer 130 and the second resin insulating layer 150) are formed. The adhesive layer 110, the first resin insulating layer 130 and the second resin insulating layer 150 are formed although these layers appear as one layer with no interface being confirmed between these layers in FIG. 30A. In example (a), the side surface 310 has a curved shape having the inflection point 320 between the first end 306 and the second end 308. Namely, the side surface 310 is convexed outward with respect to the support substrate 100 on the side closer to the second surface 304 than the inflection point 320, and is concaved inward with respect to the support substrate 100 on the side closer to the first surface 302 than the inflection point 320. The first end 306 and the end of the adhesive layer 110 located on the first surface 302 are continuous to each other.

As shown in FIG. 30B, in comparative example (b), the side surface 510 of the support substrate 500 is straight. In comparative example (b), the resin insulating layer (the adhesive layer 110, the first resin insulating layer 130 and the second resin insulating layer 150) is retracted inward with respect to the side surface 510 of the support substrate 500, and a first end 506 of a first surface 502 is exposed. Since the support substrate 500 is cut by dicing, the first end 506 has an acute angle. Namely, burr is generated at the first end 506.

As described above, in the example according to the present invention, the dicing blade used to separate the semiconductor packages into individual semiconductor packages is suppressed from being abraded, and also the shape of the side surface 310 of the support substrate 100 is smoothed. As a result, the other components are suppressed from being damaged, and the worker is protected against injury.

The present invention is not limited to any of the above-described embodiments, and may be modified appropriately without departing from the gist of the present invention.

What is claimed is:

1. A manufacturing method of a semiconductor package, comprising:
   locating an adhesive material on a metal substrate;
   locating a plurality of semiconductor devices on the adhesive material;
   forming a resin insulating layer covering the plurality of semiconductor devices;
   forming first grooves, in the resin insulating layer, enclosing each of the plurality of semiconductor devices and reaching the metal substrate;
   after forming the first grooves, forming recessed portions in the metal substrate below the first grooves; and
   forming second grooves by irradiating the metal substrate with a laser light in positional correspondence with the first grooves and melting the metal substrate where the laser light is irradiated to separate the plurality of semiconductor devices from each other.

2. The manufacturing method of a semiconductor package according to claim 1, wherein a size of the first groove is different from a size of the second groove in a planar view, the recessed portions comprise stepped portions between the first grooves and the second grooves, and the stepped portions are smoothed.

3. The manufacturing method of a semiconductor package according to claim 2, wherein each of the stepped portions comprises a consecutive curve shape.

4. The manufacturing method of a semiconductor package according to claim 1, wherein a surface of the metal substrate opposite to a surface on which the resin insulating layer is formed is irradiated with the laser light.

5. The manufacturing method of a semiconductor package according to claim 4, wherein regions each having a width smaller than that of each of the first grooves is irradiated with the laser light.

6. The manufacturing method of a semiconductor package according to claim 5, wherein the first grooves are formed by a dicing blade.

7. The manufacturing method of a semiconductor package according to claim 1, wherein regions each having a width smaller than that of each of the first grooves is irradiated with the laser light.

8. The manufacturing method of a semiconductor package according to claim 7, wherein the first grooves are formed by a dicing blade.

9. The manufacturing method of a semiconductor package according to claim 1, wherein the first grooves are formed by a dicing blade.

10. The manufacturing method of a semiconductor package according to claim 1, wherein a side surface of the metal substrate is smoothed.

11. A manufacturing method of a semiconductor package, comprising:
    locating an adhesive material on a metal substrate;
    locating a plurality of semiconductor devices on the adhesive material;
    forming a resin insulating layer covering the plurality of semiconductor devices;
    forming first grooves, in the resin insulating layer, enclosing each of the plurality of semiconductor devices and reaching the metal substrate; and
    forming second grooves by irradiating the metal substrate with a laser light in positional correspondence with the first grooves and melting the metal substrate where the laser light is irradiated to separate the plurality of semiconductor devices from each other, wherein:
    a size of the first groove is different from a size of the second groove in a planar view, and
    a stepped portion between the first groove and the second groove is smoothed.

12. The manufacturing method of a semiconductor package according to claim 11, wherein the stepped portion is a consecutive curve shape.

* * * * *